US010686225B2

(12) United States Patent
Takatsuka et al.

(10) Patent No.: US 10,686,225 B2
(45) Date of Patent: Jun. 16, 2020

(54) BATTERY, SYSTEM, BATTERY DAMAGE CALCULATION DEVICE, BATTERY MANAGEMENT METHOD, BATTERY MANAGEMENT PROGRAM, AND RECORDING MEDIUM

(71) Applicant: OMRON Corporation, Kyoto (JP)

(72) Inventors: Hiromasa Takatsuka, Kyoto (JP); Kazuki Kasai, Kyoto (JP); Taiji Yoshikawa, Kyoto (JP)

(73) Assignee: Omron Corporation, Kyoto (JP)

( * ) Notice: Subject to any disclaimer, the term of this patent is extended or adjusted under 35 U.S.C. 154(b) by 145 days.

(21) Appl. No.: 15/555,033

(22) PCT Filed: Jan. 26, 2016

(86) PCT No.: PCT/JP2016/052165
§ 371 (c)(1),
(2) Date: Aug. 31, 2017

(87) PCT Pub. No.: WO2016/143400
PCT Pub. Date: Sep. 15, 2016

(65) Prior Publication Data
US 2018/0040920 A1    Feb. 8, 2018

(30) Foreign Application Priority Data
Mar. 12, 2015   (JP) .................. 2015-049615

(51) Int. Cl.
*H01M 10/42*     (2006.01)
*G01R 31/367*    (2019.01)
(Continued)

(52) U.S. Cl.
CPC .......... *H01M 10/42* (2013.01); *G01R 31/367* (2019.01); *G01R 31/3828* (2019.01);
(Continued)

(58) Field of Classification Search
CPC .... H01M 10/42; H01M 10/425; H01M 10/48; H01M 10/486; H01M 2/10;
(Continued)

(56) References Cited

U.S. PATENT DOCUMENTS 6,323,620 B1    11/2001   Miyoshi et al.
2013/0249492 A1  9/2013   Kim et al.
(Continued)

FOREIGN PATENT DOCUMENTS

JP    2001-258175 A    9/2001
JP    2005-302337 A    10/2005
(Continued)

OTHER PUBLICATIONS

English Translation JP-2013009531, "Accumulator Battery Monitoring System and Accumulator Battery Monitoring Method, Server Device and Accumulator Battery Control Device Program" Shiyafu Yoshiaki, 47 pages (Year: 2013).*
(Continued)

*Primary Examiner* — Bryan Bui
(74) *Attorney, Agent, or Firm* — Osha Liang LLP

(57) ABSTRACT

A battery has a case, an external environment information acquisition component, and an internal environment information acquisition component. The case houses one or more cells. The external environment information acquisition component acquires specific external environment information (such as temperature and amount of sunlight) on the outside of the case. The internal environment information acquisition component acquires specific internal environment information (such as temperature and humidity) on the inside of the case.

19 Claims, 17 Drawing Sheets

(51) Int. Cl.
G01R 31/392 (2019.01)
G01R 31/3828 (2019.01)
H01M 10/48 (2006.01)
G01R 31/396 (2019.01)
H01M 2/10 (2006.01)
G01R 31/371 (2019.01)

(52) U.S. Cl.
CPC ......... *G01R 31/392* (2019.01); *G01R 31/396* (2019.01); *H01M 2/10* (2013.01); *H01M 10/425* (2013.01); *H01M 10/48* (2013.01); *H01M 10/486* (2013.01); *G01R 31/371* (2019.01); *H01M 2010/4271* (2013.01)

(58) Field of Classification Search
CPC ............... G01R 31/392; G01R 31/396; G01R 31/3828; G01R 31/367; G01R 31/382; G01R 31/41
See application file for complete search history.

(56) References Cited

U.S. PATENT DOCUMENTS

| | | | |
|---|---|---|---|
| 2013/0278216 A1 | 10/2013 | Son et al. | |
| 2013/0332103 A1 | 12/2013 | Houldsworth | |
| 2014/0089692 A1 | 3/2014 | Hanafusa | |
| 2014/0287281 A1* | 9/2014 | Murata | H01M 2/1077 429/50 |
| 2014/0342193 A1* | 11/2014 | Mull | H01M 10/4257 429/50 |
| 2015/0037642 A1* | 2/2015 | Pinon | H01M 2/1077 429/99 |
| 2015/0046109 A1 | 2/2015 | Miwa et al. | |

FOREIGN PATENT DOCUMENTS

| | | |
|---|---|---|
| JP | 2007-055450 A | 3/2007 |
| JP | 2011-118638 A | 6/2011 |
| JP | 2013-009531 A | 1/2013 |
| JP | 2013-193738 A | 9/2013 |
| JP | 2013-223423 A | 10/2013 |
| JP | 2014-186793 A | 10/2014 |
| TW | M443328 U | 12/2012 |
| WO | 2013-140781 A1 | 9/2013 |
| WO | 2013-161540 A1 | 10/2013 |

OTHER PUBLICATIONS

International Search Report issued in PCT/JP2016/052165 dated Mar. 29, 2016 (2 pages).
Office Action issued in corresponding Taiwanese Application No. 105106220, dated Oct. 27, 2016 (20 pages).
Notification of Reasons for Refusal issued in Japanese Application No. 2017-504899, dated Sep. 4, 2018 (9 pages).
Notification of Reasons for Refusal issued in Japanese Application No. 2017-504899, dated May 8, 2018 (11 pages).
Extended European Search Report issued in corresponding European Application No. 16761372.8, dated Jun. 11, 2018 (9 pages).

* cited by examiner

PHYSICAL LOAD EXAMPLE 1
(DROPPING)

PHYSICAL LOAD EXAMPLE 2
(IMPACT FROM OUTSIDE)

EXAMPLE OF RESULTS OF ESTIMATING CELL INTERNAL TEMPERATURE

VALUES SENSED BY MULTIPLE SENSORS, AND THRESHOLDS

BATTERY, SYSTEM, BATTERY DAMAGE CALCULATION DEVICE, BATTERY MANAGEMENT METHOD, BATTERY MANAGEMENT PROGRAM, AND RECORDING MEDIUM

CROSS-REFERENCE TO RELATED APPLICATIONS

This application claims the benefit of Japanese Application No. JP2015-049615, filed Mar. 12, 2015 and International Application PCT/JP2016/052165, filed Jan. 26, 2016, both of which are incorporated herein by reference in their entirety.

TECHNICAL FIELD

One or more embodiments of the present invention generally relate to a battery, a system, a battery damage calculation device, a battery management method, a battery management program, and a recording medium, and relates to a battery that is carried alone.

BACKGROUND

Conventionally, batteries (so-called secondary cells) have been used as a power supply source for an electric car. An example of such batteries is the battery pack discussed in Patent Literature 1 and 2.

Recent years have seen the advent of a system for loaning out a plurality of batteries to users of electric cars. With this system, batteries are loaned out to users of the system, and when a used battery is returned from a user, it is exchanged (swapped) with another battery that has been charged. For this reason, such systems are called a battery swap system.

CITATION LIST

Patent Literature

Patent Literature 1: Japanese Laid-Open Patent Application 2013-193738 (disclosed on Sep. 30, 2013)
Patent Literature 2: Japanese Laid-Open Patent Application 2013-223423 (disclosed on Oct. 28, 2013)

SUMMARY

Battery cells, electronic circuitry, and other such precision parts are housed in the outer case of a battery. The load to which such precision parts are subjected (such as heat, moisture, and electrical current) is a main cause of damage to a battery.

Therefore, with a battery that is installed in an electric car or the like, various sensors for acquiring internal environment information about the battery (such as a temperature sensor, a humidity sensor, and a current sensor) can be provided so that the state of the battery can be sensed.

On the other hand, as mentioned above, in a battery swap system, the batteries are taken out of the electric car and carried in by the users of the system.

For this reason, the environment of the battery while it was out on loan often cannot be ascertained, and it cannot be determined whether that battery can be loaned out again, which may cause that the batteries cannot be properly managed.

In on or more embodiments, the battery comprises an outer case, an external environment information acquisition component, and an internal environment information acquisition component. The outer case houses one or more cells. The external environment information acquisition component is configured to acquire specific external environment information on an outside of the outer case. The internal environment information acquisition component is configured to acquire specific internal environment information on an inside of the outer case.

With this configuration, environment information can be acquired on the inside of the outer case as information related to the load on the battery from the internal environment. Also, environment information can be acquired on the outside of the outer case, when the outer case of the battery is exposed to the external environment, as information related to the load on the battery from the external environment. The degree of damage to the battery or its usage state can be determined, for example, on the basis of the acquired environment information, so the state of the battery can be accurately ascertained, and the batteries can be properly managed.

The battery pertaining to one or more embodiments of the invention is the battery pertaining to one or more other embodiments, wherein the external environment information acquisition component and the internal environment information acquisition component are same type of sensor.

With this configuration, changes on the outside and inside of the outer case due to the same kinds of environmental factors can be sensed, and the effect that the external environment has on the internal environment can be ascertained.

The battery pertaining to one or more embodiments is the battery pertaining to one or more other embodiments, wherein the external environment information acquisition component has one or more temperature sensors, and the internal environment information acquisition component has one or more temperature sensors. The specific external environment information is temperature on the outside of the outer case, and the specific internal environment information is temperature on the inside of the outer case.

With this configuration, the temperature on the inside of the outer case and the temperature on the outside of the outer case can be used to determine to high accuracy the usage state and the degree of damage to the battery caused by temperature load (heat).

The battery pertaining to one or more embodiments is the battery pertaining to one or more other embodiments, wherein the external environment information acquisition component and the internal environment information acquisition component are different types of sensor.

With this configuration, it is possible to acquire environment information on the outside and inside due to different kinds of environmental factors.

The battery pertaining to one or more embodiments is the battery pertaining to one or more other embodiments, wherein the external environment information acquisition component has one or more sunlight sensors, and the internal environment information acquisition component has one or more temperature sensors. The specific external environment information is an amount of sunlight on the outer case, and the specific internal environment information is temperature on the inside of the outer case.

With this configuration, when the temperature on the inside of the outer case rises, the sunlight sensor can determine whether the temperature rise is "caused by the user placing the battery in the sun" or "caused by a rise in air temperature."

Therefore, when the temperature rise is due to how the battery is used by the user, a warning can be issued to the user.

The battery pertaining to one or more embodiments is the battery pertaining to one or more other embodiments, wherein the internal environment information acquisition component has a plurality of internal environment information acquisition sensors disposed between the cells and walls of the outer case.

With this configuration, the internal environment between the cells and the walls of the outer case can be sensed more accurately. Also, the temperature of the cells can be accurately estimated.

The battery pertaining to one or more embodiments is the battery pertaining to one or more other embodiments, further comprising a cell housing case disposed on the inside of the outer case and formed so as to surround the one or more cells. At least one of the internal environment information acquisition sensors is disposed near the cells and on the inside of the cell housing case, and at least one of the internal environment information acquisition sensors is disposed on the inside of the outer case and on the outside of the cell housing case.

With this configuration, it is possible to accurately sense the environment on the inside and outside of the cell housing case, and on the inside of the outer case.

The battery pertaining to one or more embodiments is the battery pertaining to one or more other embodiments, further comprising a communication component configured to send the specific external environment information acquired by the external environment information acquisition component and the specific internal environment information acquired by the internal environment information acquisition component to an infatuation processing device configured to analyze environment information about the battery.

When a communication component is thus provided, it is possible to send internal environment information and external environment information about the battery to the information processing device in real time while the battery is out on loan, and the degree of damage and the usage state of the battery can be determined.

The battery pertaining to one or more embodiments is the battery pertaining to one or more other embodiments, wherein the information processing device is a virtual server in cloud computing.

An information processing device may be provided as a virtual server in cloud computing, and the communication component may transmit to the cloud computing system. The user can obtain the analysis results by accessing the cloud computing system.

The system pertaining to one or more embodiments comprises the battery pertaining to one or more other embodiments and an information processing device. The information processing device has a battery environment information acquisition component and an environment information analysis component. The battery environment information acquisition component is configured to acquire the specific external environment information from the external environment information acquisition component, and acquire the specific internal environment information from the internal environment information acquisition component. The environment information analysis component is configured to use the specific external environment information and the specific internal environment information acquired by the battery environment information acquisition component to analyze environment information about the battery.

With this configuration, since information about the environment of battery while it is out on loan can be obtained, the degree of damage and the usage state can be determined, and in a battery swap system, the state of the batteries can be accurately ascertained, and the batteries can be properly managed.

Also, the battery may have a communication component, an information processing device may be provided as a cloud computing system, and the communication component may transmit to the cloud computing system. The user can obtain the analysis results by accessing the cloud computing system.

The system pertaining to one or more embodiments is the system pertaining to one or more other embodiments, wherein the environment information analysis component has a damage calculator configured to use the specific external environment information and the specific internal environment information acquired by the battery environment information acquisition component to calculate degree of damage to the battery.

With this configuration, environment information taken from the inside and the outside of the outer case can be used to determine the degree of damage to the battery to a high accuracy.

This allows the degree of damage to the battery to be calculated, and whether the battery should be inspected, repaired, discarded, etc., can be determined on the basis of the degree of damage.

The system pertaining to one or more embodiments is the system pertaining to one or more other embodiments, wherein the environment information analysis component further has a usability determination component configured to determine whether or not the battery can be used, on the basis of the degree of damage calculated by the damage calculator.

With this configuration, whether to use a battery can be determined automatically on the basis of the degree of damage.

The system pertaining to one or more embodiments is the system pertaining to one or more other embodiments, wherein the environment information analysis component has a usage state determination component configured to use the specific external environment information and the specific internal environment information acquired by the battery environment information acquisition component to determine a usage state of the battery.

With this configuration, the usage state of the battery while it was out on loan can be analyzed. That is, how the battery was handled by the renter can be evaluated, and it is possible to bring this to the attention of that renter.

The system pertaining to one or more embodiments is the system pertaining to one or more other embodiments, wherein the external environment information acquisition component has a temperature sensor, and the specific external environment information is temperature on the outside of the outer case. The internal environment information acquisition component has one or more temperature sensors disposed between the cells and walls of the outer case, and the specific internal environment information is temperature on the inside of the outer case. The environment information analysis component estimates temperature of the cells on the basis of the values sensed by the temperature sensor had by the external environment information acquisition component and the temperature sensor had by the internal environment information acquisition component.

With this configuration, the temperature of the cells can be accurately estimated on the basis of the temperature sensor on the outside of the outer case and the temperature sensor on the inside of the outer case. Therefore, it is possible to accurately determine the usage state and the degree of damage to the cells.

The battery damage calculation device pertaining to one or more embodiments comprises an external environment information acquisition component, an internal environment information acquisition component, and a damage calculator. The external environment information acquisition component is configured to acquire specific external environment information on an outside of the outer case of the battery. The internal environment information acquisition component is configured to acquire specific internal environment information on an inside of the outer case. The damage calculator is configured to use the specific external environment information and the specific internal environment information to calculate degree of damage to the battery.

With this configuration, the environment information on the inside and outside of the outer case can be used to determine the degree of damage to the battery to high accuracy.

The battery management method pertaining to one or more embodiments is a battery management method for managing a battery comprising an outer case that houses one or more cells, the battery management method comprising an environment information acquisition step and an environment information analysis step. The environment information acquisition step involves acquiring specific external environment information on an outside of the outer case and specific internal environment information on an inside. The environment information analysis step involves using the specific external environment information and the specific internal environment information acquired in the environment information acquisition step to analyze environment information about the battery.

With this configuration, it is possible to acquire environment information on the inside of the outer case, as information about the load on the battery from the internal environment. Also, when the outer case of the battery is exposed to the external environment, environment information on the outside of the outer case can be acquired as information about the load on the battery from the external environment. The acquired environment information can be used, for example, to determine the usage state and the degree of damage to the battery, and to appropriately manage the battery.

The battery management method pertaining to one or more embodiments is the battery management method pertaining to one or more other embodiments, having a degree of damage calculation step and a usability determination step. The degree of damage calculation step involves using the specific external environment information and the specific internal environment information acquired in the environment information acquisition step to calculate degree of damage to the battery. The usability determination step involves determining whether or not the battery can be used on the basis of the degree of damage calculated in the degree of damage calculation step.

With this configuration, the environment information on the inside and outside of the outer case can be used to determine the degree of damage to the battery to high accuracy.

The battery management method pertaining to one or more embodiments is the battery management method pertaining to one or more other embodiments, wherein the environment information analysis step has a usage state determination step of using the specific external environment information and the specific internal environment information acquired in the environment information acquisition step to determine a usage state of the battery.

This makes it possible to analyze the usage state of the battery while it was out on loan. That is, how the battery was handled by the renter, etc., can be evaluated, and it is possible to bring this to the attention of that renter.

The battery management method pertaining to one or more embodiments is the battery management method pertaining to one or more other embodiments, wherein the specific external environment information is temperature on the outside of the outer case, and the specific internal environment information is temperature on the inside of the outer case. The environment information analysis step has a cell interior temperature estimation step and a degree of damage calculation step. The cell interior temperature estimation step involves using the temperature on the outside of the outer case and the temperature on the inside of the outer case acquired in the environment information acquisition step to estimate temperature on the inside of the cells. The degree of damage calculation step involves calculating the degree of damage to the battery from a result of estimating the temperature on the inside of the cells in the cell interior temperature estimation step.

This allows environment information on the inside and outside of the outer case to be used to determine the usage state and the degree of damage to the battery to high accuracy.

The battery management program pertaining to one or more embodiments is a battery management program for managing a battery comprising an outer case that houses one or more cells, wherein the battery management program causes a computer to execute a battery management method comprising an environment information acquisition step and an environment information analysis step. The environment information acquisition step involves acquiring specific external environment information on an outside of the battery and specific internal environment information on an inside. The environment information analysis step involves using the specific external environment information and the specific internal environment information acquired in the environment information acquisition step to analyze environment information about the battery.

This allows environment information on the inside and outside of the outer case to be used to determine the usage state and the degree of damage to the battery to high accuracy.

One mode of utilization of the program may be a mode in which the program is transmitted through a transmission medium such as the Internet, or a transmission medium such as light, radio waves, sound waves, etc., is read by a computer, and runs in conjunction with the computer. The program may also be provided to a server in a cloud computing system.

The recording medium pertaining to one or more embodiments is a recording medium to which the battery management program pertaining to one or more other embodiments is recorded, and which is configured to be processed by a computer.

Thus, the program may be recorded to a ROM or other such recording medium.

The battery pertaining to one or more embodiments is a battery that is carried in alone in a system in which a plurality of batteries are configured to be loaned out, the battery comprising an outer case and an external environment information acquisition component. The outer case houses one or more cells. The external environment information acquisition component is configured to acquire specific external environment information on an outside of the outer case.

With this configuration, external environment information about the outer case of the battery while it was out on loan can be acquired. Therefore, the usage state and the degree of damage to the battery while it was out on loan can be accurately determined.

The battery pertaining to one or more embodiments is the battery pertaining to one or more other embodiments, further comprising a communication component configured to send the specific external environment information acquired by the external environment information acquisition component to an information processing device configured to analyze environment information about the battery.

Thus providing a communication component allows external environment information about the battery while it is out on loan to be sent to the information processing device in real time, and allows the usage state and the degree of damage to the battery to be determined.

The battery pertaining to one or more embodiments is the battery pertaining to one or more other embodiments, wherein the information processing device is a virtual server in cloud computing.

Thus, an information processing device may be provided as a virtual server in cloud computing, and a communication component may transmit to the cloud computing system. The user can obtain the analysis result by accessing the cloud computing system.

The battery pertaining to one or more embodiments is the battery pertaining to one or more other embodiments, further comprising a storage component configured to store the specific external environment information acquired by the external environment information acquisition component.

This makes it possible to record external environment information about the battery while it was out on loan. Therefore, when the battery is returned to the battery management device, the external environment information stored in the battery can be used to determine the usage state and the degree of damage to the battery.

The battery pertaining to one or more embodiments is the battery pertaining to one or more other embodiments, wherein the external environment information acquisition component has at least one of the following: a temperature sensor, a humidity sensor, a sunlight sensor, an illuminance sensor, an image sensor, a gas sensor, a sound wave sensor, a magnetic sensor, a radio wave sensor, and a submersion sensor.

A temperature sensor can measure the temperature on the outside of the outer case. A humidity sensor can measure the humidity on the outside of the outer case. A sunlight sensor and an illuminance sensor can sense sunlight or other light that shines on the outer case. This makes it possible to determine that the battery has been left in the sun, etc. An image sensor can sense an image of the outside of the outer case, so an image sensor can detect that the battery was left in an environment in which dust or other foreign matter was suspended. A gas sensor can sense suspended gas in the outer case, and can sense the environment in which the battery was disposed while it was out on loan. A sound wave sensor can also sense the environment in which the battery was disposed while it was out on loan. A magnetic sensor and a radio wave sensor can detect that a device that generates electromagnetic waves was disposed in the vicinity of the battery, etc. A submersion sensor can detect that the outer case was wetted by water.

One or more embodiments of the present invention allow batteries to be properly managed.

DETAILED DESCRIPTION

Embodiments of the present invention will now be described in detail.

Battery Swap System 1

Figure 1:
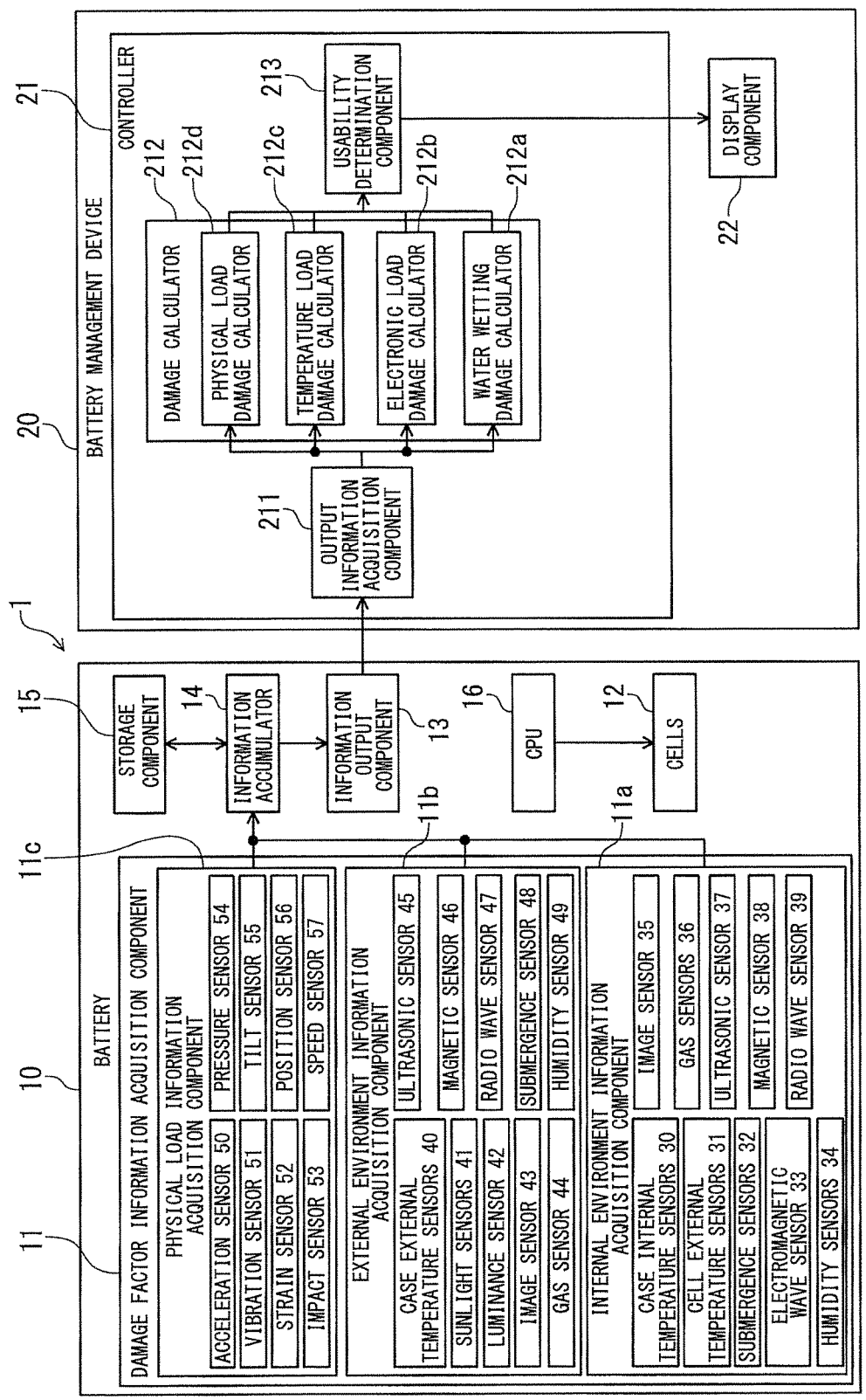
FIG. 1 is a block diagram showing the configuration of a battery swap system pertaining to one or more embodiments.

FIG. 1 is a block diagram showing the configuration of a battery swap system 1 (hereinafter abbreviated as the system 1) pertaining to one or more embodiments. As shown in FIG. 1, the system 1 includes a battery 10 and a battery management device 20. Although only one battery 10 is shown in FIG. 1, the system 1 actually includes a plurality of batteries 10.

The system 1 loans out a plurality of batteries 10 to users of the system 1. After the batteries 10 are loaned out to the users of the system 1, they are installed in vehicles such as electric cars and used as the electrical power supply to the vehicle. After this, the batteries 10 are returned to the station of the system 1. The returned batteries 10 are recharged at the station and then loaned out again to other users of the system 1.

Although not depicted, the system 1 may further comprise a capacitor information acquisition component that uses various sensors (such as a current sensor, a power sensor, a voltage sensor, and a temperature sensor) to acquire information about cells 12 (power storage units). Also, the system may further comprise a usage load information acquisition component that uses various sensors (such as a current sensor, a power sensor, and a voltage sensor) to acquire information about power usage load.

Battery 10

As shown in FIG. 1, the battery 10 comprises a damage factor information acquisition component 11 (sensor), the cells 12, an information output component 13, an information accumulator 14, a storage component 15, a cell housing case 18, and a CPU 16. The various components of the battery 10 (more precisely, excluding an external environment information acquisition component 11b of the damage factor information acquisition component 11) are housed in a case 17 (outer case) (see FIG. 2).

Figure 2A:
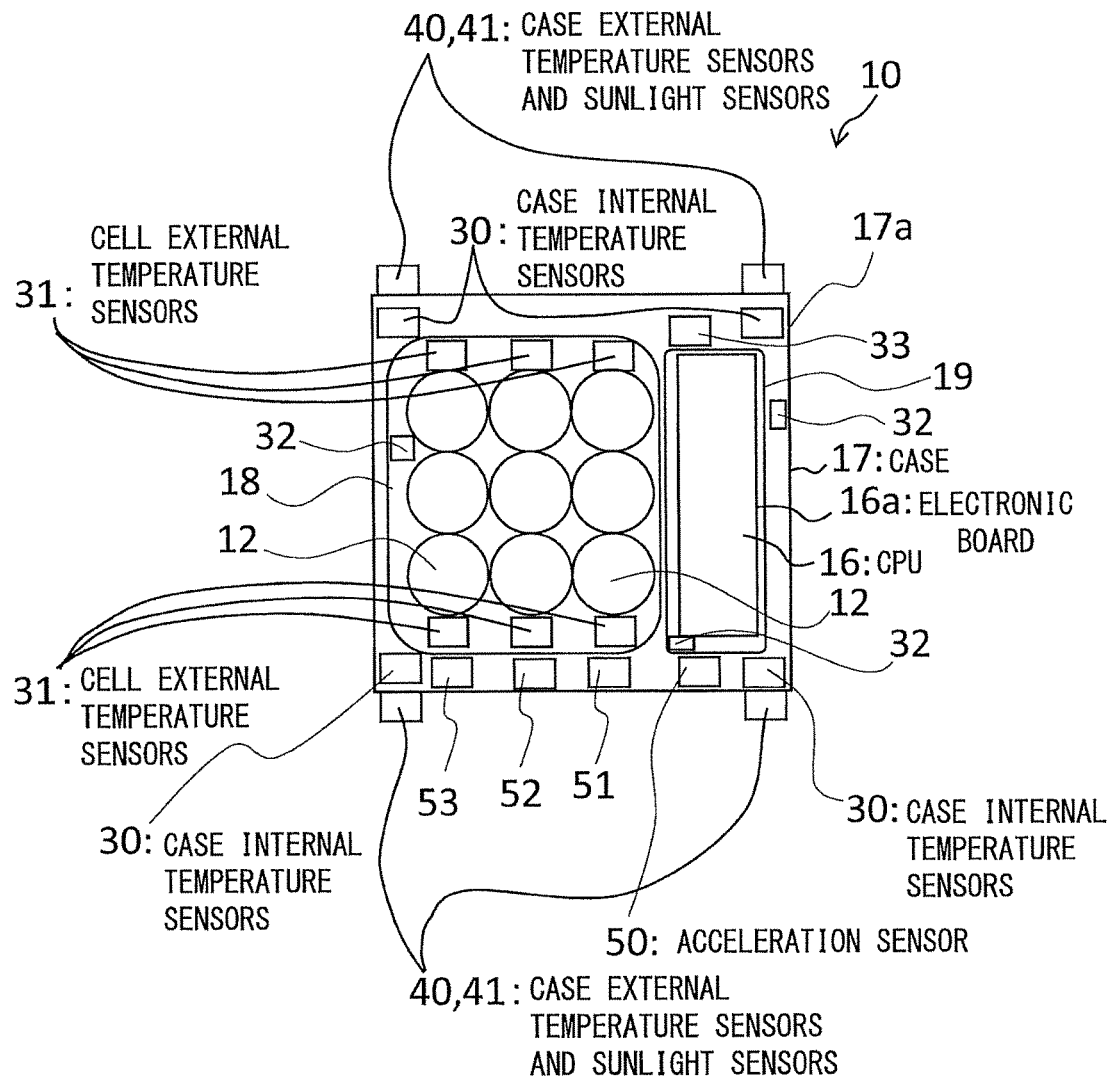
FIG. 2A is a diagram showing an example of the layout of sensors in the case of a battery used in a battery swap system pertaining to one or more embodiments.

FIG. 2A is a diagram showing the configuration of the battery 10, and shows an example of the layout of various sensors (discussed below). As shown in FIG. 2A, a plurality of cells 12 are disposed close to each other in the case 17. These cells 12 are surrounded by the cell housing case 18 disposed inside the case 17. The CPU 16 is disposed inside the case 17 and outside the cell housing case 18. Nine of the cells 12 are disposed in three rows, in each of which three cells are disposed in a straight line. The CPU 16 is disposed on an electronic board 16a, and the electronic board 16a is surrounded by an electronic board housing case 19.

The cell housing case 18 and the electronic board housing case 19 have the functions of protecting and waterproofing the components they house.

Damage Factor Information Acquisition Component 11

The damage factor information acquisition component 11 acquires damage factor infatuation, which is information related to factors that damage a battery 10. Damage factors include physical load, electronic load, thermal load, moisture, and the like. Examples of damage factors will be given below. The damage factor information acquired by the damage factor information acquisition component 11 is outputted to the information accumulator 14.

As shown in FIG. 1, the damage factor information acquisition component 11 includes an internal environment information acquisition component 11a, an external environment information acquisition component 11b, and a physical load information acquisition component 11c (physical load sensor).

FIGS. 2A to 2D show examples of the layout of the damage factor information acquisition component 11 (the internal environment information acquisition component 11a, the external environment information acquisition component 11b, and the physical load information acquisition component 11c) in the case 17 of the battery 10.

Internal Environment Information Acquisition Component 11a

The internal environment information acquisition component 11a acquires information about the internal environment, which is the environment within the case 17 of the battery 10, as damage factor information.

As shown in FIGS. 1 and 2A, the internal environment information acquisition component 11a comprises case internal temperature sensors 30, cell external temperature sensors 31, submergence sensors 32, and an electromagnetic wave sensor 33, as internal environment acquisition sensors. The case internal temperature sensors 30 sense the temperature inside the case 17, the cell external temperature sensors 31 sense the temperature outside the cells 12, and the submergence sensors 32 sense information indicating whether the battery 10 has been submerged. The internal environment information acquired by the internal environment information acquisition component 11a includes the values (sensing results) sensed by the case internal temperature sensors 30, the cell external temperature sensors 31, the submergence sensors 32, and the electromagnetic wave sensor 33.

The internal environment information acquisition component 11a need not include all of the above-mentioned types of sensors, and may include any one of these types of sensor.

As shown in FIG. 2A, the case internal temperature sensors 30 provided to the internal environment information acquisition component 11a are disposed in the four corners inside the case 17, which is rectangular in shape, and the cell external temperature sensors 31 are disposed near the cells 12. The cell external temperature sensors 31 are disposed inside the cell housing case 18 that surrounds the cells 12.

The submergence sensors 32 can be, for example, a moisture detection sensor that reads a change in the resistance value when water adheres to it. The submersion sensors 32 may also detect submergence by sensing the color of a submergence detection seal with an image sensor. The submersion sensors 32 are disposed inside the cell housing case 18 along with the cells 12. As shown in FIG. 2A, the submersion sensors 32 may be disposed inside the case 17 and outside the cell housing case 18. Furthermore, the submergence sensors 32 may be disposed inside the electronic board housing case 19. This makes it possible to determine up to what level water has penetrated.

The electromagnetic wave sensor 33 detects electromagnetic waves, and can detect that a device generating electromagnetic waves has approached the battery 10, for example. As shown in FIG. 2A, the electromagnetic wave sensor 33 may be disposed inside the case 17 and in the vicinity of the CPU 16. Disposing the electromagnetic wave sensor 33 in the vicinity of the CPU 16 allows the effect on the CPU 16 to be sensed.

Figure 2B:
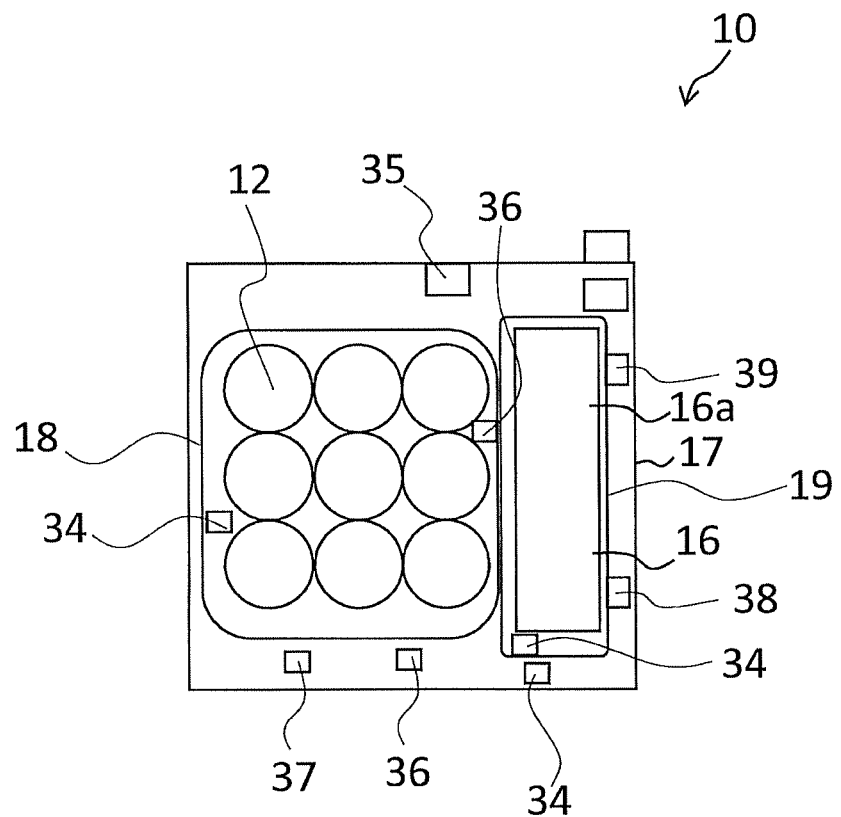
FIG. 2B is a diagram showing an example of the layout of sensors in the case of a battery used in a battery swap system pertaining to one or more embodiments.

As shown in FIG. 1, the internal environment information acquisition component 11a may also comprise one or more of the following: a humidity sensor 34, an image sensor 35, a gas sensor 36, an ultrasonic sensor 37, a magnetic sensor 38, and a radio wave sensor 39. FIG. 2B is a diagram showing an example of the layout of these sensors.

As shown in FIG. 2B, the humidity sensors 34 may be disposed inside the cell housing case 18 or outside the cell housing case 18, and inside the case 17. The humidity sensors 34 sense the humidity inside the case 17. The humidity sensors 34 may be housed inside the cell housing case 18. It is also possible to detect water wetting with the humidity sensors 34.

As shown in FIG. 2B, for example, the image sensor 35 may be disposed on an inner face of the case 17. The image sensor 35 can detect intrusion of foreign matter such as dust, for example.

As shown in FIG. 2B, for example, the gas sensors 36 may be disposed inside the case 17 and inside or outside the cell housing case 18. The gas sensors 36 can detect the incursion of gas into the case 17 and can sense the environment in which the battery 10 was disposed while it was out on loan. The ultrasonic sensor 37 may be disposed inside the case 17 as shown in FIG. 2B. The magnetic sensor 38 and the radio wave sensor 39 may be disposed inside the case 17 and in the vicinity of the CPU 16, as shown in FIG. 2B. Disposing the magnetic sensor 38 and the radio wave sensor 39 in the vicinity of the CPU 16 allows the effect on the CPU 16 to be detected.

When the internal environment information acquisition component 11a comprises the above-mentioned types of sensors, the internal environment information acquired by the internal environment information acquisition component 11a includes the values (sensing results) sensed by the humidity sensors 34, the image sensor 35, the gas sensors 36, the ultrasonic sensor 37, the magnetic sensor 38, and the radio wave sensor 39.

A vibration sensor 51 of the physical load information acquisition component 11c (discussed below) may be had by the internal environment information acquisition component 11a.

Also, there are no limitations on the positions and numbers of the sensors described with reference to FIGS. 1, 2A, and 2B.

External Environment Information Acquisition Component 11b

The external environment information acquisition component 11b acquires information about the external environment, which is the environment outside the case 17 of the battery 10, as damage factor information.

As shown in FIG. 1, the external environment information acquisition component 11b comprises case external temperature sensors 40 and sunlight sensors 41. The external environment information includes the sensing values produced by the case external temperature sensors 40 and the sunlight sensors 41.

The external environment information acquisition component 11b need not include both of the above-mentioned two types of sensor, and may include just one of them.

As shown in FIG. 2A, the case external temperature sensors 40 and the sunlight sensors 41 of the external environment information acquisition component 11b are disposed at the four corners on the outside of the rectangular case 17. The case external temperature sensors 40 can measure the temperature outside the case 17. More precisely, as will be discussed below, the temperature of the cells 12 can be accurately sensed on the basis of the values sensed by the case internal temperature sensors 30 and the cell external temperature sensors 31.

The sunlight sensors 41 sense how long the battery 10 is exposed to the sun, and can detect, for example, that the battery 10 is left in the sunshine by the user.

The external environment information acquisition component 11b may comprise one or more of the following: a luminance sensor 42, an image sensor 43, a gas sensor 44, an ultrasonic sensor 45, a magnetic sensor 46, a radio wave sensor 47, a submergence sensor 48, and a humidity sensor 49.

Figure 2C:
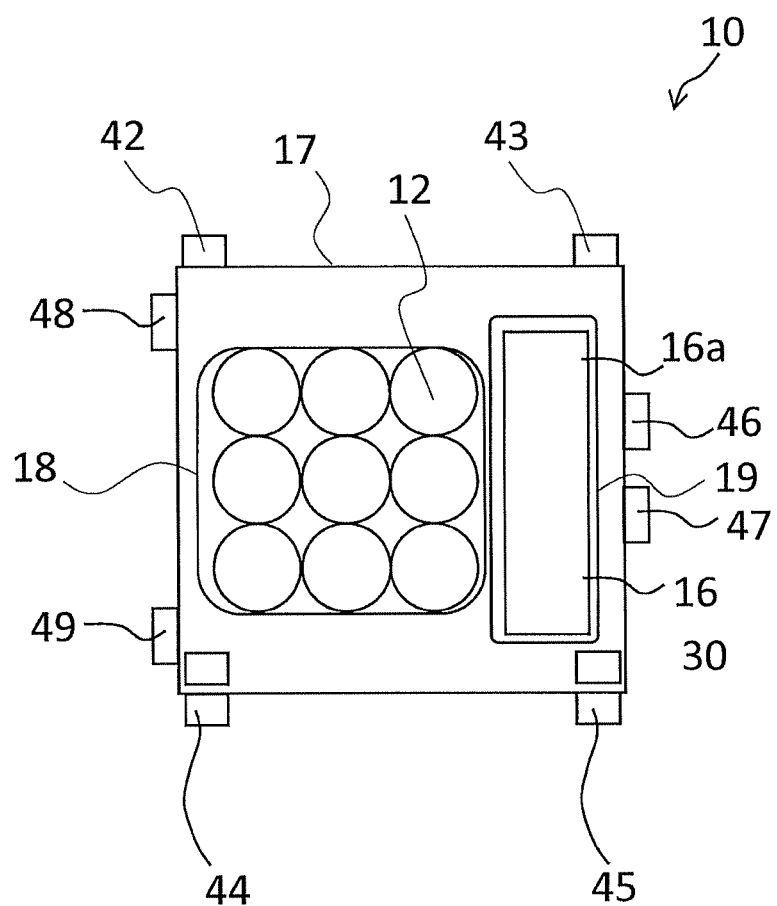
FIG. 2C is a diagram showing an example of the layout of sensors in the case of a battery used in a battery swap system pertaining to one or more embodiments.

As shown in FIG. 2C, the luminance sensor 42 is disposed on the outer surface of the case 17, for example, and can sense the brightness of the light that shines on the battery 10. As shown in FIG. 2C, the image sensor 43 is disposed, for example, on the outer surface of the case 17, and can sense, as an image, the environment where the battery 10 is disposed. The image sensor 43 makes it possible to detect that the battery was placed in an environment in which foreign matter such as dust was suspended, for example. As shown in FIG. 2C, the gas sensor 44 is disposed on the outer surface of the case 17, for example, and can sense the environment in which the battery 10 was disposed while out on loan. As shown in FIG. 2C, the sound wave sensor 45 is disposed on the outer surface of the case 17, for example, and can detect sound waves. The magnetic sensor 46 and the radio wave sensor 47 may be disposed on the outer surface of the case 17 and in the vicinity of the CPU 16. Disposing the magnetic sensor 46 and the radio wave sensor 47 in the vicinity of the CPU 16 allows the effect on the CPU 16 to be sensed.

The submergence sensor 48 is provided outside the case 17, and just as with the above-mentioned submersion sensor 32, submersion may be detected using a moisture detection sensor, or may be detected by sensing the color of a submergence detection seal by an image sensor. The submersion sensor 48 can detect that the case 17 has been wetted with water.

The humidity sensor 49 is provided outside of the case 17, and senses the humidity outside the battery 10.

In FIG. 2C, only one of each of the luminance sensor 42, the image sensor 43, the gas sensor 44, the ultrasonic sensor 45, the magnetic sensor 46, the radio wave sensor 47, the submergence sensor 48, and the humidity sensor 49 is provided, but a plurality of them may be disposed around the case 17, as with the case external temperature sensors 40 and the humidity sensor 49 in FIG. 2A. For example, in the case of the illuminance sensor 42, it may be provided on all sides so that it can perform its sensing no matter which side is facing the sun.

The battery 10 may comprise, inside the case 17 at least one internal environment information acquisition component 11a that acquires specific environment information, and outside the case 17 at least one external environment information acquisition component 11b that acquires the corresponding (same) environment information. In FIG. 2A, the case internal temperature sensors 30 of the internal environment information acquisition component 11a sense the temperature inside the case 17 as specific environment information, and the case external temperature sensors 40 sense the temperature outside the case 17 as corresponding environment information.

The specific environment information acquired on the inside of the case 17 and the corresponding environment information acquired on the outside of the case 17 are used to calculate the degree of damage to the battery 10. For instance, the temperature in the cells 12 is estimated (see FIG. 7) from the temperature inside the case 17 (specific environment information) and the temperature outside the case 17 (corresponding environment information). The degree of damage to the battery 10 based on the temperature load is calculated from the estimated temperature inside the cells 12.

A plurality of the case internal temperature sensors 30 are disposed between the cells 12 and the walls 17a of the case 17. More precisely, the case internal temperature sensors 30 are disposed in the four corners inside the case 17 and in the cell housing case 18. This allows a change in temperature from the cells 12 toward the outside to be detected, and allows the temperature in the cells 12 to be estimated more accurately.

The specific environment information and the corresponding environment information are not limited to temperature. For example, the specific environment information and the corresponding environment information may be humidity, or may be whether or not the battery 10 has been submerged.

Also, the specific environment information acquired by the internal environment information acquisition component 11a (specific internal environment information) and the specific environment information acquired by the external environment information acquisition component 11b (specific external environment information) are not limited to being the same type of information, and may instead be different types of information. For example, the specific environment information acquired by the internal environment information acquisition component 11a may be temperature, and the specific environment information acquired by the external environment information acquisition portion 11b may be illuminance.

Physical Load Information Acquisition Component 11c

The physical load information acquisition component 11c acquires physical load information, which is information about the physical load to which the battery 10 is subjected, as damage factor information.

As shown in FIGS. 1 and 2A, the physical load information acquisition component 11c comprises an acceleration sensor 50, a vibration sensor 51, a strain sensor 52, and an impact sensor 53. The physical load information includes the various values sensed by the acceleration sensor 50, the vibration sensor 51, the strain sensor 52, and the impact sensor 53.

The physical load information acquisition component 11c need not include all of the types of sensors mentioned above, and may comprise a sensor of any one type.

In FIG. 2A, the acceleration sensor 50 of the physical load information acquisition component 11c is disposed in one corner of the case 17 of the battery 10. The acceleration sensor 50 may be disposed anywhere inside or outside the battery 10 (on an outer face of the case 17, etc.).

When the physical load information acquisition component 11c has the acceleration sensor 50, acceleration information about battery 10 is acquired. Therefore, how much acceleration the battery 10 was subjected to can be ascertained on the basis of the acquired acceleration information, so the degree of damage and the usage state of the battery can be determined. Also, the acceleration sensor 50 can be used to sense information such as the direction in which the battery 10 was dropped, for example.

As shown in FIG. 2A, the vibration sensor 51 is disposed in the case 17, but just as with the acceleration sensor 50, it may be disposed anywhere inside or outside the battery 10 (such as on an outer face of the case 17). The vibration sensor 51 senses what kind of vibration the battery 10 was subjected to (vibration information), so the degree of damage and the usage state of the battery 10 can be determined.

As shown in FIG. 2A, the strain sensor 52 is provided on an inner wall of the case 17, for example, and senses information about the strain on the case 17 produced by the physical load exerted on the case 17. The strain sensor 52 senses what kind of impact or the like the battery 10 was subjected to, so the degree of damage and the usage state of the battery 10 can be determined. A strain gauge can be used as the strain sensor 52, for example. Also, strain sensors 52 may be disposed on all of the faces of the case 17, which will allow information such as which face is subjected to a load (such as which face is subjected to an impact, on which face the battery is dropped, or other such information) to be sensed. The strain sensor 52 may be provided on either an inner or outer face of the case 17. Also, when strain sensors 52 are provided to both the cell housing case 18 and the case 17 surrounding the cells 12, it can be determined whether or not an impact has reached the inside, and the degree of damage can be determined more precisely. Furthermore, when the strain sensor 52 is provided to the electronic board housing case 19 that houses the electronic board in the battery 10, it can be determined whether an impact has reached the electronic board 16a.

As shown in FIG. 2A, the impact sensor 53 is disposed in the case 17, but just as with the acceleration sensor 50, the impact sensor 53 may be disposed anywhere inside or outside the battery 10 (such as on an outer face of the case 17). The impact sensor 53 senses impacts to which the battery 10 is subjected (impact information), so the degree of damage and the usage state of the battery 10 can be determined.

The physical load information acquisition component 11c may comprise at least one of the following: a pressure sensor 54, a tilt sensor 55, a position sensor 56, and a speed sensor 57.

Figure 2D:
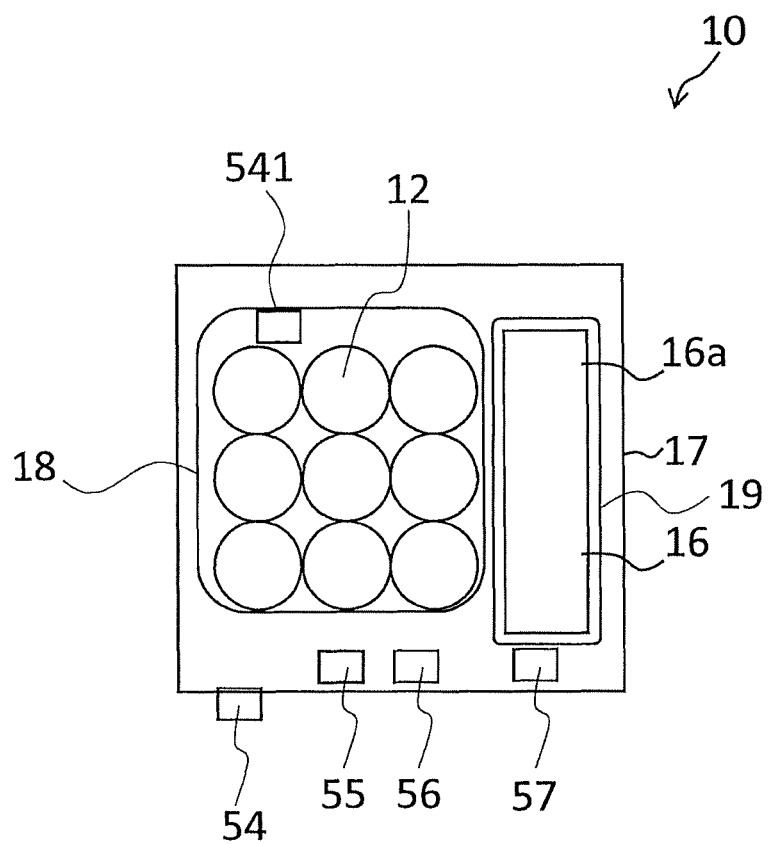
FIG. 2D is a diagram showing an example of the layout of sensors in the case of a battery used in a battery swap system pertaining to one or more embodiments.
Figure 3:
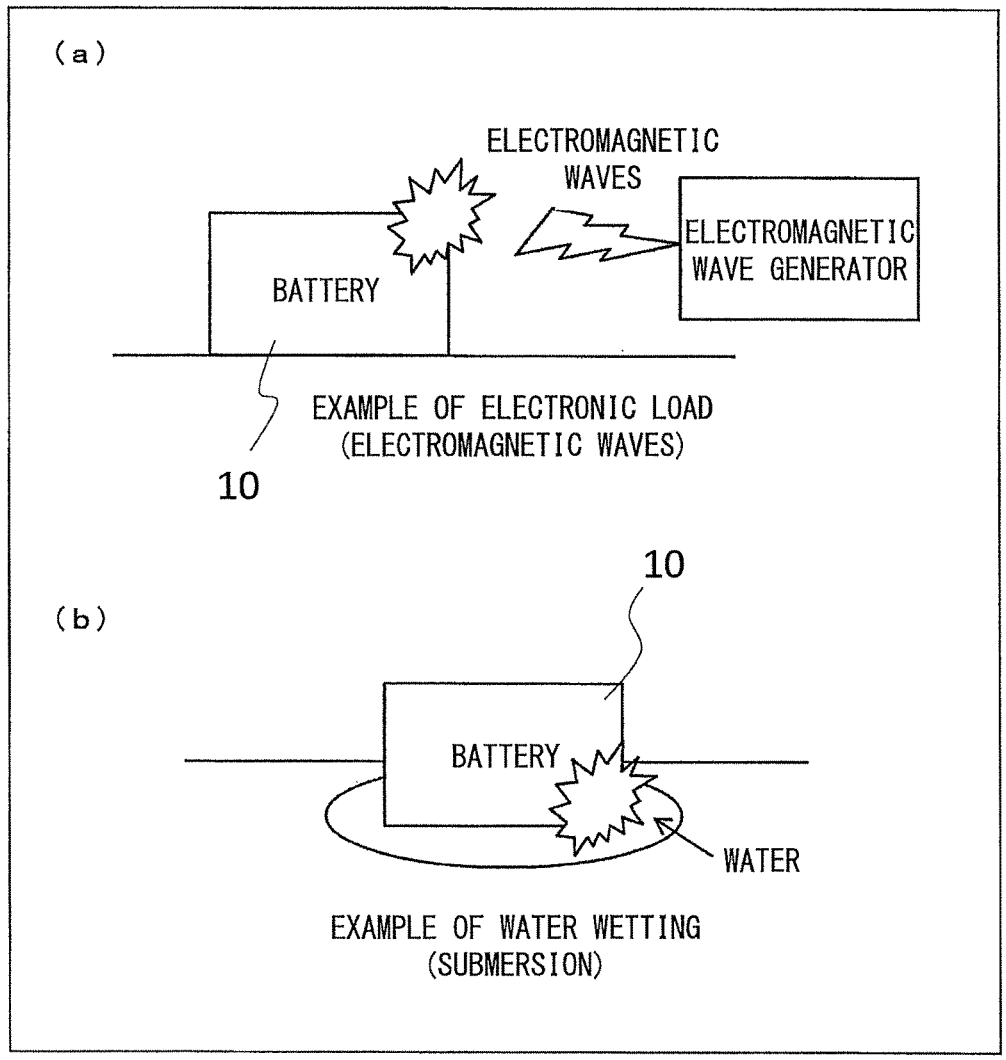
FIGS. 3a and 3b show examples of factors that cause damage to the batteries in the battery swap system pertaining to one or more embodiments.
Figure 4:
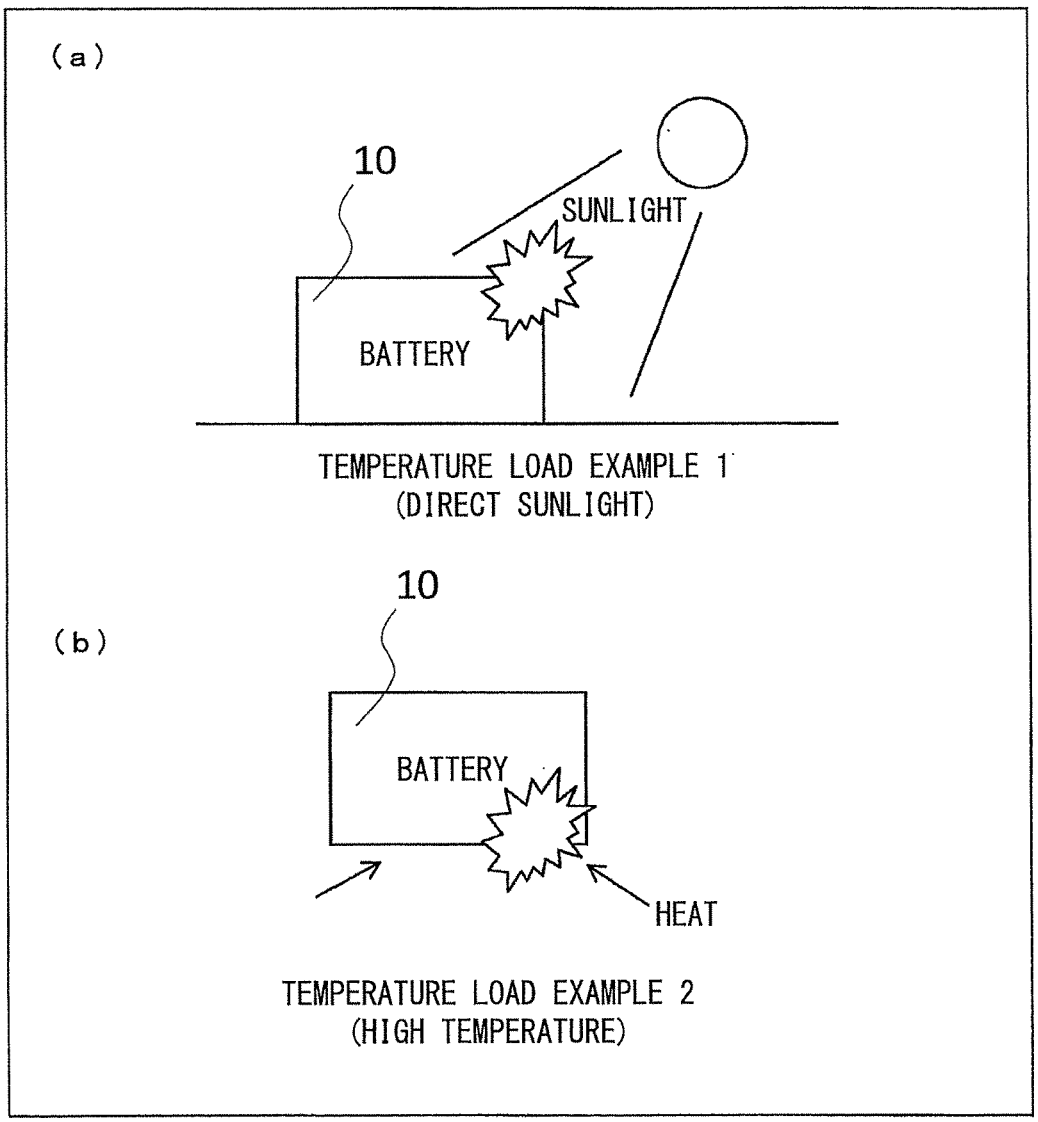
FIGS. 4a and 4b show other examples of factors that cause damage to the batteries in the battery swap system pertaining to one or more embodiments.
Figure 5:
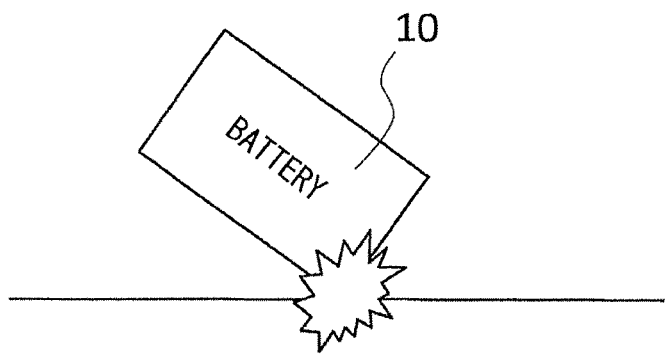
FIGS. 5a and 5b show still other examples of factors that cause damage to the batteries in the battery swap system pertaining to one or more embodiments.
Figure 5:
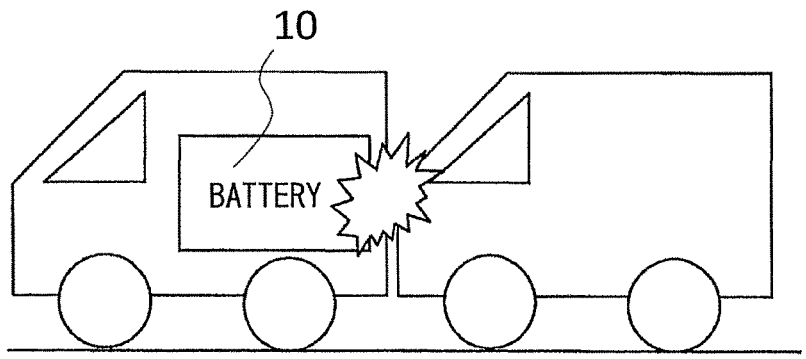

FIG. 2D is a diagram showing an example of the layout of the pressure sensor 54, the tilt sensor 55, the position sensor 56, and the speed sensor 57.

As shown in FIG. 2D, the pressure sensor 54 is disposed outside the case 17, and can sense the pressure to which the battery 10 is subjected. Because the pressure to which the battery was subjected (pressure information) can thus be ascertained, the degree of damage and the usage state of the battery 10 can be determined. Although the pressure sensor 54 is disposed at only one site in FIG. 2D, pressure sensors 54 can be disposed on a plurality of faces of the battery 10 in order to acquire information such as which face was subjected to an impact, or on which face the battery was dropped.

An air pressure sensor may also be used as the pressure sensor 54. As shown in FIG. 2D, when an air pressure sensor 541 is provided in the cell housing case 18 of the case 17, when the case 17 (a sealed container) is damaged, it will be possible to detect minute damage.

As shown in FIG. 2D, the tilt sensor 55 is disposed inside the casing 17, and senses inclination of the battery 10 while it is out on loan (inclination information). This makes it possible to acquire information related to the disposition orientation of the battery 10 while it is out on loan.

The position sensor 56 is disposed inside the casing 17 in FIG. 2D, and senses the position in the height direction of the battery 10 (position information). Thus sensing the position in the height direction allows speed and acceleration to be calculated.

As shown in FIG. 2D, the speed sensor 57 is disposed inside the casing 17, and senses the speed of the battery 10 (speed information). Acceleration information can be calculated from the movement speed of the battery 10.

Examples of Damage Factors

Examples of factors that cause damage to the battery 10 will be described through reference to FIGS. 3a and 3b to 5a and 5b.

FIGS. 3a and 3b show examples of damage factors by which the battery 10 is damaged when the internal environment of the battery 10 is changed. In FIG. 3a, electromagnetic waves applied to the battery 10 (electronic load) are a damage factor, and in FIG. 3b, moisture entering the interior of the battery 10 (water wetting) is a damage factor. As shown in FIG. 3a, when the battery 10 is irradiated with electromagnetic waves, the CPU 16 of the battery 10 may malfunction and the interior of the battery 10 may be damaged. Also, as shown in FIG. 3b, when the battery 10 is submerged in water, moisture that finds its way into the interior of the battery 10 tends to produce condensation inside the battery 10. Water droplets produced by this condensation can lead to malfunction of the CPU 16 of the battery 10, so this is a factor that can damage the battery 10.

FIGS. 4a and 4b show examples of damage factors by which the battery 10 is damaged by changing the external environment of the battery 10. In FIG. 4a, direct sunlight shining on the battery 10 when the battery 10 is left outdoors, etc., (thermal load) is a damage factor. When the battery 10 is exposed to direct sunlight, the temperature of the battery 10 rises. Also, in FIG. 4b, a high temperature to which the battery 10 is exposed (thermal load) is a damage factor. When the battery 10 is exposed to a high temperature, the temperature of the battery 10 rises. When the battery 10 is left at a high temperature for an extended period of time, there is a possibility that the battery 10 will be damaged.

FIGS. 5a and 5b show examples of physical load as a damage factor. In FIGS. 5a and 5b, an impact to which the battery 10 is subjected (physical load) is a damage factor. As shown in FIG. 5a, when the user of the system 1 drops the battery 10, there will be a collision between the battery 10 and the ground, and the battery 10 will be subjected to a powerful impact. Also, as shown in FIG. 5b, when a vehicle in which the battery 10 is installed collides with another vehicle, the battery 10 will be subjected indirectly to a powerful impact (physical load). When the battery 10 is thus subjected to a large impact, there is the possibility that the interior of the battery 10 (mainly the structural components, supporting members that support these components, etc.) will separate or break.

Cells 12, CPU 16

The cells 12 are cells of a secondary battery. As shown in FIGS. 2A to 2D, the battery 10 comprises a plurality of cells 12. Each cell 12 can be charged with electricity supplied from outside of the battery 10, and can discharge the stored electric power. Switching between charging and discharging of the cells 12 is controlled by the CPU 16.

Information Output Component 13, Information Accumulator 14

The information accumulator 14 stores the damage factor information inputted from the damage factor information acquisition component 11 in the storage component 15. Also, the information accumulator 14 outputs the damage factor information accumulated in the storage component 15 to the information output component 13. The information output component 13 outputs the damage factor information inputted from the information accumulator 14 as output information to an output information acquisition component 211 of the battery management device 20.

Storage Component 15

Damage factor information is stored in the storage component 15 by the information accumulator 14. The damage factor information includes the internal environment information acquired by the internal environment information acquisition component 11a, the external environment information acquired by the external environment information acquisition component 11b, and the physical load information acquired by the physical load information acquisition component 11c.

Battery Management Device 20

As shown in FIG. 1, the battery management device 20 comprises a controller 21 (information processing device) and a display component 22. The controller 21 comprises the output information acquisition component 211, a damage calculator 212, and a usability determination component 213. The components of the controller 21 use the output information outputted from the battery 10 (that is, damage factor information) to calculate the damage degree of the battery 10 and to execute usability determination processing of determining whether or not the battery 10 can continue to be used. The controller 21 then causes the display component 22 to display the determination result of the usability determining processing. In a modification example, the controller 21 may present the determination result of the usability determining processing to the user by some means other than a display. The usability determination processing will be described in detail below. Also, the damage calculator 212 and the usability determination component 213 correspond to examples of a physical load information analysis component.

Output Information Acquisition Component 211

The output information acquisition component 211 acquires output information from the information output component 13 of the battery 10. The output information acquired by the output information acquisition component 211 is the damage factor information acquired by the damage factor information acquisition component 11 of the battery 10, and includes internal environment information, external environment information, and physical load information. The output information acquisition component 211 outputs the acquired output information to the damage calculator 212.

Damage Calculator 212

The damage calculator 212 uses the output information inputted from the output information acquisition component 211 to calculate the four types of degree of damage described below (the degree of physical load damage, the degree of temperature load damage, the degree of electronic load damage, and the degree of water wetting damage). Information related to the calculated degree of damage is then outputted to the usability determination component 213. As shown in FIG. 1, the damage calculator 212 includes a water wetting damage calculator 212a, an electronic load damage calculator 212b, a temperature load damage calculator 212c, and a physical load damage calculator 212d. In a modification example, the damage calculator 212 may calculate some index other than degree of damage, so long as it is one that indicates the usage state of the battery.

Water Wetting Damage Calculator 212a

The water wetting damage calculator 212a calculates the degree of water wetting damage, which is the degree of damage to the battery 10 caused by water wetting (see FIG. 3b). To that end, the water wetting damage calculator 212a selects internal environment information from the output information. As described above, the internal environment information includes the various values sensed by the case internal temperature sensors 30, the cell external temperature sensors 31, the submergence sensors 32, and the electromagnetic wave sensor 33. The water wetting damage calculator 212a uses the values sensed by the submergence sensors 32 to calculate the degree of water wetting damage to the battery 10. Alternatively, when the internal environment information acquisition component 11a is equipped with the humidity sensors 34, the water wetting damage calculator 212a can also use the values sensed by the humidity sensors 34 to calculate the degree of water wetting damage to the battery 10.

For example, the degree of water wetting damage may correspond to the frequency of malfunction of the CPU 16 of the battery 10. In this case, the correlation (mathematical model) between the values sensed by the submergence sensors 32 and the frequency of malfunction of the CPU 16 of the battery 10 is learned in advance by experimentation. The water wetting damage calculator 212a calculates the degree of water wetting damage (the frequency of malfunction due to water wetting) from the values sensed by the submergence sensors 32, on the basis of the learned correlation.

Electronic Load Damage Calculator 212b

The electronic load damage calculator 212b calculates the degree of electronic load damage, which is the degree of damage to the battery 10 due to electronic load (see FIG. 3a). Electronic load includes radio waves, magnetism, and electromagnetic waves to which the battery 10 is exposed. The electronic load damage calculator 212b selects internal environment information from the output information. The electronic load damage calculator 212b uses the value sensed by the electromagnetic wave sensor 33 of the internal environment information acquisition component 11a to calculate the degree of electronic load damage. Alternatively, when the internal environment information acquisition component 11a is equipped with the magnetic sensor 38 and the radio wave sensor 39, the electronic load damage calculator 212b can use the value sensed by the magnetic sensor 38, the value sensed by the radio wave sensor 39, or a combination of these to calculate the degree of electronic load damage to the battery 10.

For example, when the degree of electronic load damage corresponds to the frequency of malfunction of the CPU 16 of the battery 10, the correlation between the value sensed by the electromagnetic wave sensor 33 and the frequency of occurrence of malfunction of the CPU 16 of the battery 10 is learned in advance by experimentation. The electronic load damage calculator 212b then calculates the degree of electronic load damage (the frequency of malfunction due to electronic load) from the value sensed by the electromagnetic wave sensor 33 on the basis of the learned correlation.

Temperature Load Damage Calculator 212c

The temperature load damage calculator 212c uses the temperature inside the cells 12 (the cell internal temperature) to calculate the degree of damage to the battery 10 due to temperature load (degree of temperature load damage) (see FIGS. 4a and 4b).

For example, when the degree of temperature load damage corresponds to the frequency of malfunction of the CPU 16 of the battery 10, the correlation between the cell internal temperature and the frequency of occurrence of malfunction of the CPU 16 of the battery 10 is learned in advance by experimentation. The temperature load damage calculator 212c then calculates the degree of temperature load damage (the frequency of malfunction due to temperature load) from the cell internal temperature on the basis of the learned correlation.

Here, since the damage factor information acquisition component 11 is not equipped with temperature sensors in the cells 12 (see FIG. 2A), the cell internal temperature cannot be acquired. In view of this, the temperature load damage calculator 212c selects external environment information and internal environment information from the output information. The temperature load damage calculator 212c then estimates the cell internal temperature from the temperature around the cells 12 (that is, the values sensed by the case internal temperature sensors 30 and the cell external temperature sensors 31 of the internal environment information acquisition component 11a, and the values sensed by the case external temperature sensors 40 of the external environment information acquisition component 11b). The specific method for estimating cell internal temperature will be described in detail below.

Physical Load Damage Calculator 212d

The physical load damage calculator 212d calculates the degree of damage to the battery 10 (mainly the structural components) due to physical load (degree of physical load damage) (see FIGS. 5a and 5b). To that end, the physical load damage calculator 212d selects physical load information from the output information. The physical load damage calculator 212d uses the values sensed by the acceleration sensor 50, the vibration sensor 51, the strain sensor 52, and the impact sensor 53 of the physical load information acquisition component 11c to calculate the degree of physical load damage.

For example, the degree of physical load damage may correspond to the degree of damage to the structural components and support members of the battery 10. In this case, the correlation between the values sensed by the acceleration sensor 50, the vibration sensor 51, the strain sensor 52, and the impact sensor 53 and the degree of damage to the battery 10 is learned in advance by experimentation. The physical load damage calculator 212d then calculates the degree of physical load damage (the degree of damage to the structural components and support members due to physical load) from the values sensed by the acceleration sensor 50, the vibration sensor 51, the strain sensor 52, and the impact sensor 53 on the basis of the learned correlation.

Usability Determination Component 213

The usability determination component 213 determines whether or not the four kinds of degree of damage calculated by the various components of the damage calculator 212 (the degree of physical load damage, the degree of temperature load damage, the degree of electronic load damage, and the degree of water wetting damage) exceed their respective thresholds. Then, when at least one of the degrees of damage exceeds its threshold, the usability determination component 213 determines that the battery 10 cannot be continued to be used. On the other hand, when all four kinds of degree of damage are at or under their thresholds, the usability determination component 213 determines that it is possible to continue using the battery 10. The threshold may be different for each type of degree of damage.

The above-mentioned threshold may be decided using experimental data showing the correlation between the degree of damage and the damage factors (electronic load, water wetting, electronic load, physical load). The specific method for deciding the thresholds will be described in detail below.

Usability Determination Processing

Figure 6:
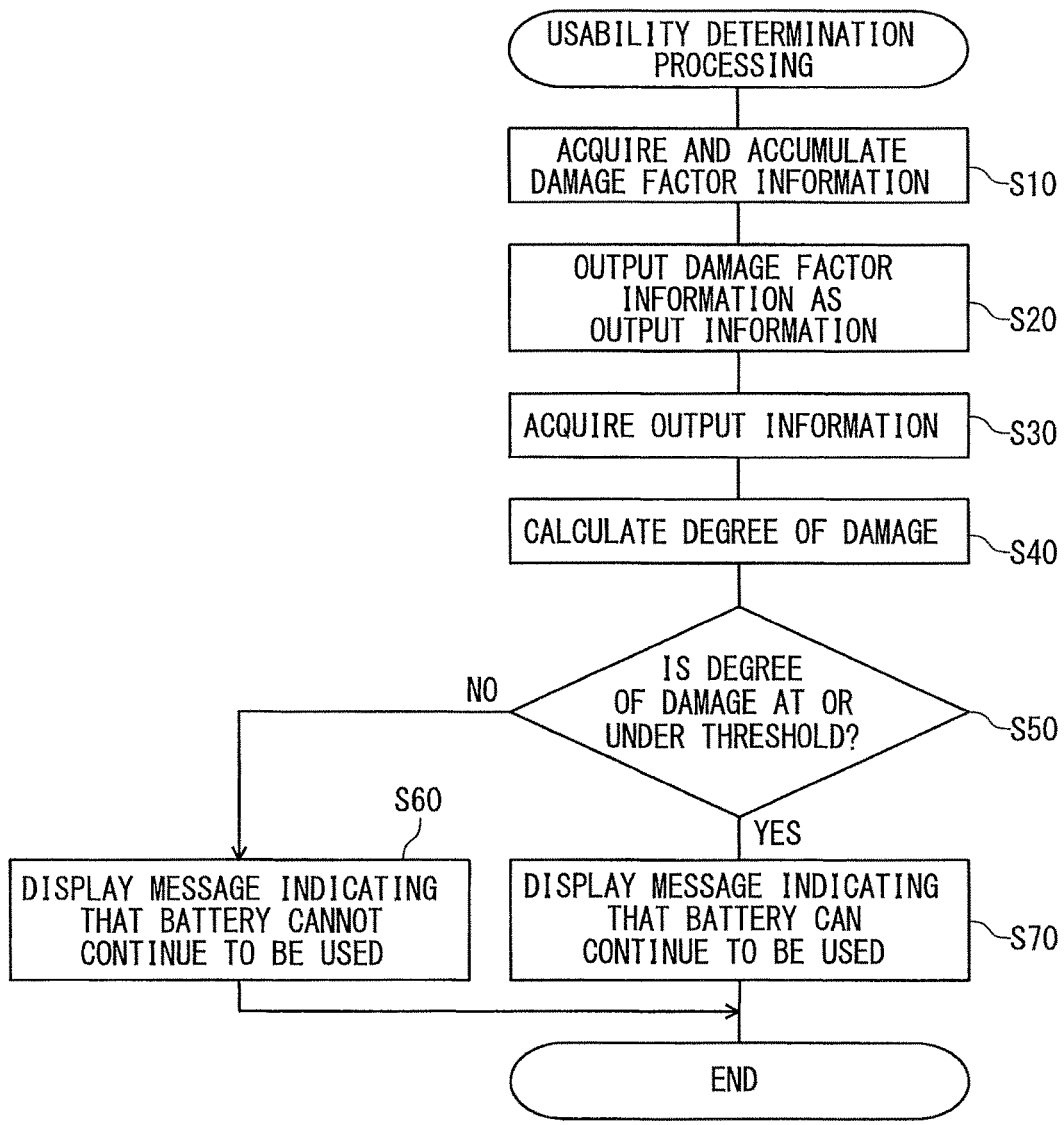
FIG. 6 is a flowchart showing the flow of the usability determination processing executed by a controller in the battery swap system pertaining to one or more embodiments.

The flow of usability determination processing executed by the controller 21 will now be described through reference to FIG. 6. FIG. 6 is a flowchart showing the flow of the usability determination processing. However, S10 and S20 shown in FIG. 6 are executed in the battery 10 as a preliminary stage to usability determination processing by the controller 21.

As shown in FIG. 6, in the usability determination processing, the damage factor information acquisition component 11 acquires damage factor information, and the information accumulator 14 stores the damage factor information in the storage component 15 (S10).

Next, the information output component 13 outputs the damage factor information as output information (S20). The output information acquisition component 211 acquires the output information outputted from the information output component 13, that is, the damage factor information (S30, environment information acquisition step).

The various components of the damage calculator 212 use the output information acquired from the output information acquisition component 211 (damage factor information) to calculate the degree of damage to the battery 10 (S40, environment information analysis step, damage calculation step). The usability determination component 213 determines whether or not the degree of damage to the battery 10 calculated by the damage calculator 212 is at or below the threshold (S50, environment information analysis step, usability determination step). More precisely, the usability determination component 213 determines whether or not each of the four types of degree of damage calculated by the damage calculator 212 is at or below the threshold.

Here, when the degree of damage to the battery 10 due to temperature load is calculated, the damage calculator 212 uses the various output information indicating the case external temperature and case internal temperature to estimate the cell internal temperature before S40 (cell internal temperature estimation step) (see "method for estimating cell temperature"). Then, in S40, the damage calculator 212 uses the estimated cell internal temperature to calculate the degree of damage to the battery 10 due to temperature load.

When degree of damage to the battery 10 (at least one of the four types of degree of damage) is not at or below the threshold (No in S50), the usability determination component 213 causes the display component 22 to display a message of "cannot continue using battery 10" (S60). On the other hand, when the degree of damage to the battery 10 is at or below the threshold (Yes in S50), the usability determination component 213 causes the display component 22 to display a message of "can continue using battery 10" (S70). This concludes the usability determination processing.

Method for Estimating Cell Internal Temperature

Figure 7:
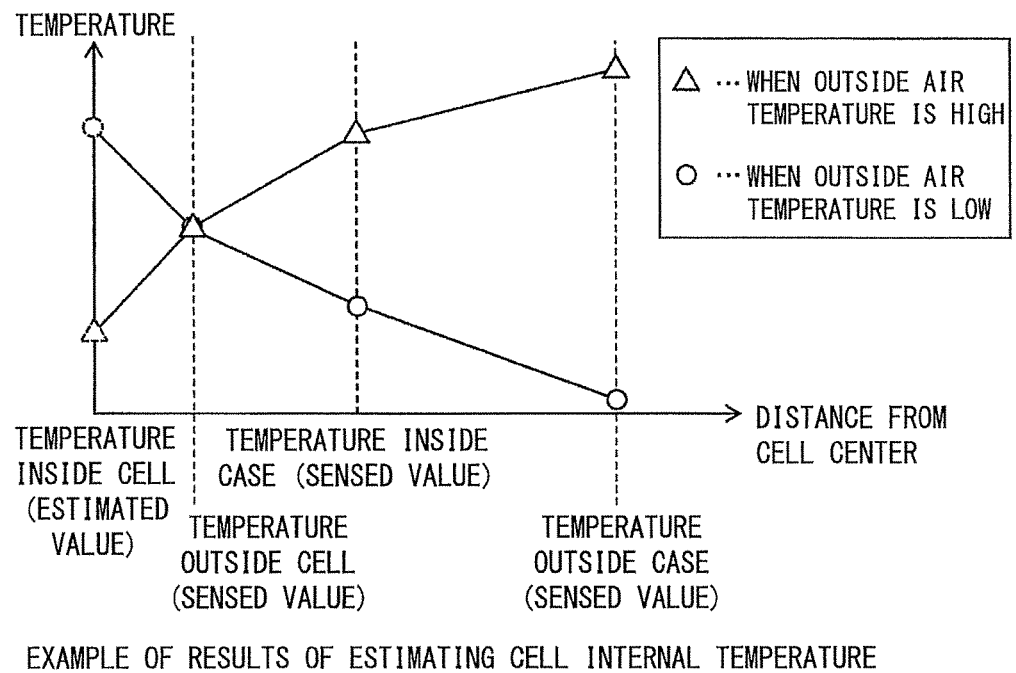
FIG. 7 is a graph of the results of estimating the cell internal temperature with a temperature load damage calculator provided to the battery swap system pertaining to one or more embodiments.

How the temperature load damage calculator 212c calculates the temperature inside the cells 12 (cell internal temperature) using the case external temperature, the case internal temperature, and the cell external temperature will be described through reference to FIG. 7. FIG. 7 is a diagram showing an example of the result of estimating the cell internal temperature with the temperature load damage calculator 212c. Let us consider two cases: when the case external temperature is higher than the case internal temperature and the cell external temperature, and when the case external temperature is lower than the case internal temperature and the cell external temperature. We will assume the cell external temperature to be the same in both cases. The case external temperature is sensed by the case external temperature sensors 40, the case internal temperature is sensed by the case internal temperature sensors 30, and the cell external temperature is sensed by the cell external temperature sensors 31.

Since the case external temperature corresponds to the outside air temperature, when the case external temperature is higher than the case internal temperature and cell external temperature, the outside air temperature is considered to be higher than the cell internal temperature. Also, the cell internal temperature is considered less likely than the cell external temperature to be affected by the outside air temperature. Therefore, when the case external temperature is higher than the case internal temperature and the cell external temperature (in FIG. 7, when the outside air temperature is high), the cell internal temperature is considered to be lower than outside the cell external temperature. In view of this, the temperature load damage calculator 212c estimates the cell internal temperature to be lower than the cell external temperature by extending a curve that passes through the case external temperature, the case internal temperature, and the cell external temperature, as shown in FIG. 7.

On the other hand, when the case external temperature is lower than the case internal temperature and the cell external temperature, the cell internal temperature is considered to be higher than the outside air temperature because of heat generated inside the cells 12. Also, when heat is generated inside the cells 12, the cell internal temperature is considered to be higher than the cell external temperature. Therefore, when the cell external temperature is lower than the case internal temperature and the case external temperature (in FIG. 7, when the outside air temperature is low), the cell internal temperature is considered to be higher than the cell external temperature. In view of this, the temperature load damage calculator 212c estimates the cell internal temperature to be higher than the cell external temperature by extending a curve that passes through the case external temperature, the case internal temperature, and the cell external temperature, as shown in FIG. 7.

Method for Deciding Threshold

How the threshold used by the usability determination component 213 to make its determination is decided will be described through reference to FIGS. 8 and 9. Here, let us consider a case in which the damage factors are physical load (acceleration, vibration, strain, and impact). To decide on a threshold experimentally, with a physical load is applied to the battery 10, and the values sensed by the acceleration sensor 50, the vibration sensor 51, the strain sensor 52, and the impact sensor 53 of the physical load information acquisition component 11c are each acquired.

Figure 8:
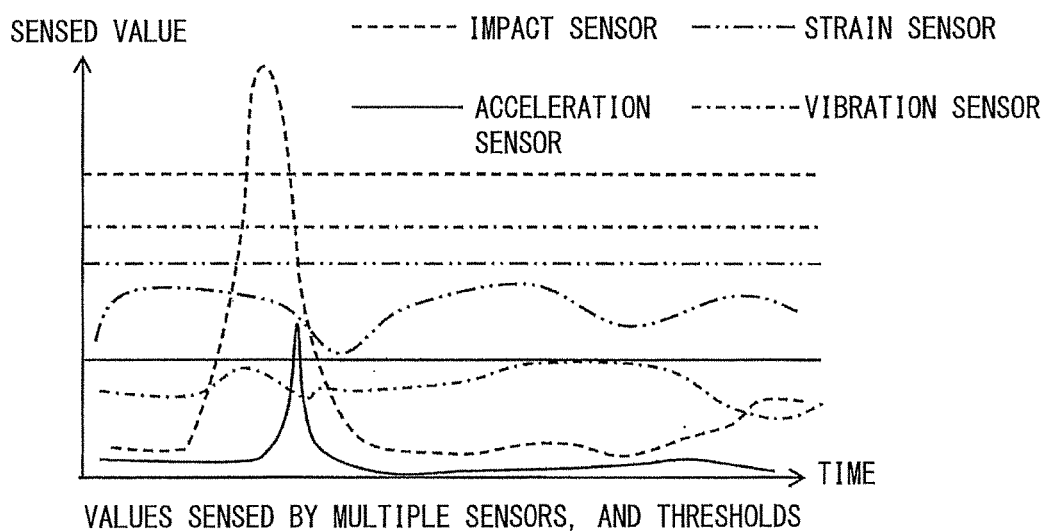
FIG. 8 is a graph of an example of sensed value acquired by a physical load information acquisition component provided to a battery swap system pertaining to one or more embodiments.

FIG. 8 is a graph showing examples of the sensed values acquired by the physical load information acquisition component 11c. As shown in FIG. 8, the physical load information acquisition component 11c acquires the sensed values for the acceleration, vibration, strain, and impact to which the battery 10 is subjected. The maximum values for the sensed values during the period in which the physical load is applied are specified as the damage factors of the battery 10. After this, the degree of damage to the battery 10 is determined from the degree of damage to the structural components, support members, and so forth of the battery 10. This yields a set of experimental data indicating the relation between the degree of damage and a damage factor of the battery 10 (sensed value for acceleration). It is further determined whether or not a battery 10 whose degree of damage has been determined has been damaged to the extent that it cannot continued to be used.

Figure 9:
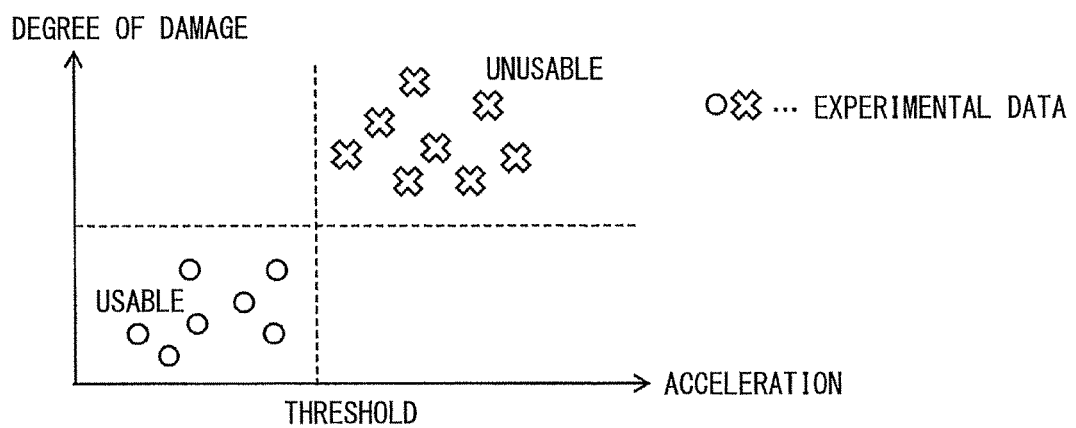
FIG. 9 is a graph of experimental data indicating the relation between acceleration and degree of damage to a battery in a battery swap system pertaining to one or more embodiments.

FIG. 9 is a graph plotting experimental data indicating the relation between the degree of damage and a damage factor of the battery 10 (sensed value for acceleration). The experimental data shown in FIG. 9 includes experimental data for batteries 10 that have been damaged to the extent that they cannot continue to be used (in FIG. 9, the experimental data marked "unusable"), and experimental data for batteries 10 that have not been damaged to this extent (in FIG. 9, the experimental data marked "usable"). As shown in FIG. 9, the threshold for acceleration is decided to be a value that can distinguish "unusable" experimental data from "usable"

experimental data. The threshold of the degree of damage is decided to be a value corresponding to the threshold of acceleration, using the correlation between acceleration and the degree of damage.

A battery swap system 1001 in one or more embodiments of the present invention (hereinafter referred to as the system 1001) will now be described.

Figure 10:
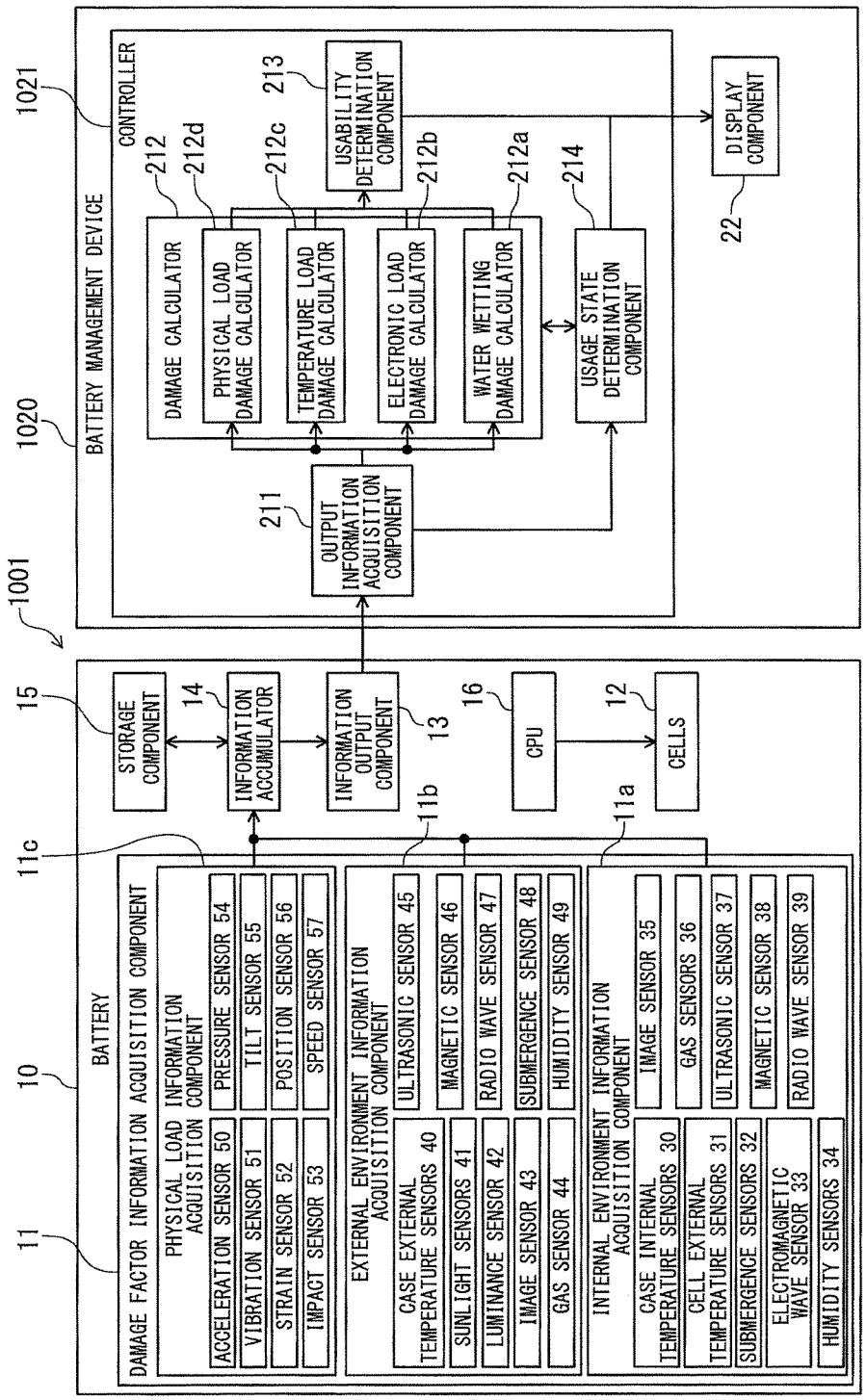
FIG. 10 is a block diagram showing the configuration of a battery swap system pertaining to one or more embodiments.

The system 1001, as shown in FIG. 10, differs from the system 1 in one or more other embodiments in that the system 1001 comprises a usage state determination component 214 (environment information analysis component). Therefore, the description will focus on this difference. Those components that are the same as in one or more other embodiments will be numbered the same.

A controller 1021 of a battery management device 1020 in the battery swap system 1001 shown in FIG. 10 further has the usage state determination component 214 in addition to the output information acquisition component 211, the damage calculator 212, and the usability determination component 213.

The battery management device 1020 determines the usage state of the battery 10 on the basis of the internal environment information, the external environment information, and the physical load information acquired by the output information acquisition component 211.

Figure 11:
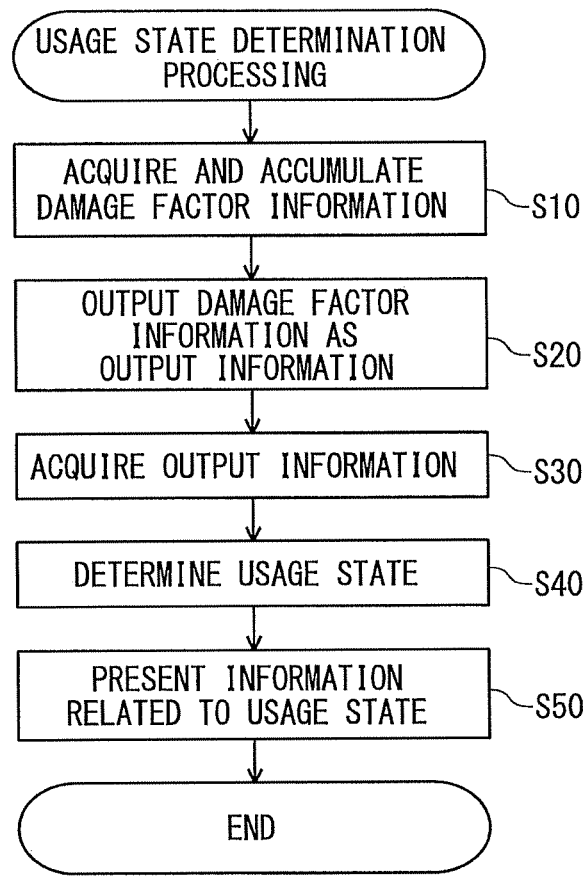
FIG. 11 is a flowchart showing the flow in the usage state determination processing executed by the controller in a battery swap system pertaining to one or more embodiments.

FIG. 11 is a flowchart of the usage state determination processing (battery management method) in one or more embodiments. From S10 to S30, the flowchart shown in FIG. 11 is the same as FIG. 6 in one or more embodiments.

Using the output information acquired in S30, in S40 (usage state determination step, environment information analysis step) the usage state determination component 214 determines the usage state of the battery 10 while it was out on loan. Here, the determination of the usage state is, for example, determining whether or not the user used the battery correctly, or whether the user used the battery correctly but the battery was subjected to a damage factor due to an environmental factor, or the battery was subjected to a damage factor due to how the battery was used by the user, etc. More specifically, it can be determined that the battery 10 was subjected to a damage factor because the user left the battery 10 exposed to the sun, or that the battery 10 was subjected to a damage factor because the outside air temperature rose to an unforeseen temperature. The usage state determination component 214 may also determine the usage state on the basis of an index that indicates the usage state calculated by the damage calculator 212.

Next, in S50, the display component 22 displays the determined usage state. A display is not the only option here, and the battery management device 1020 may have a communication component, and the determined usage state may be sent to a portable information terminal (smart phone, tablet, etc.) owned by the user. For example, when the usage state determination component 214 determines that damage has been caused by the user, a warning or the like may be sent to the portable information terminal of the user.

Usage State Determination Example 1

As shown in FIG. 2A, a configuration in which the sunlight sensors 41 are disposed on the outside of the case 17 of the battery 10 and the case internal temperature sensors 30 are disposed on the inside of the case 17 will be described as an example.

The usage state determination component 214 determines the cause for the temperature information on the basis of the sensed values from the sunlight sensors 41 and the sensed values from the case internal temperature sensors 30. More specifically, when the values from the case internal temperature sensors 30 have risen, the usage state determination component 214 can determine from the values sensed by the sunlight sensors 41 whether the increase in the temperature inside the case 17 is "due to the battery 10 being left in sunlight" or is "due to a rise in the outside air temperature."

When the temperature rise is "due to the battery 10 being left in sunlight," the usage state determination component 214 displays a warning on the display component 22. The battery management device 1020 may comprise a communication component, and a warning may be sent to a portable information terminal (smart phone, tablet, etc.) of the user.

On the other hand, when the temperature information is "due to a rise in the outside air temperature," the usage state determination component 214 does not give a display or a notification to the user since there is a limit to what can be done on the user side.

When we say that the usage state determination component 214 determines the usage state on the basis of an index indicating the usage state calculated by the damage calculator 212, it means, for example, that sunlight exposure time is converted into an index to calculate the degree of damage, and when the degree of damage due to sunlight exposure time is at or over a specific length of time, the user is determined to be the cause.

Also, the cell external temperature sensors 31 may be further provided as sensors of the temperature inside the case 17, in addition to the case internal temperature sensors 30. That is, different kinds of sensors may be provided outside and inside the case 17, and a plurality of sensors of the same type may be provided inside the case 17.

Usage State Determination Example 2

As shown in FIG. 2A, a configuration in which a submergence sensor 32 (second submergence sensor) is disposed in the electronic board housing case 19, and another submergence sensor 32 (first submergence sensor) is disposed in the cell housing case 18 will be described as an example.

The usage state determination component 214 can determine which region in the battery 10 was submerged, and make an evaluation of the flooding range. For example, when the electronic board housing case 19 has been flooded, but the cell housing case 18 has not been flooded, the electronic board 16a is replaced, but there is a high probability that the cells 12 can be checked and reused. On the other hand, when the cell housing case 18 is flooded, it will be necessary to replace the cells 12.

Thus, the usage state determination component 214 can determine the state of submersion, which is helpful in repair and replacement. The submergence sensors 32 may also be disposed on the outside of the cell housing case 18 and the inside of the case 17.

Also, when a plurality of submergence sensors 32 are attached, degree of damage values may be set for water incursion into the case 17, for water incursion into the electronic board housing case 19, and for water incursion into the cell housing case 18, and the degree of damage calculated.

Example Using Software

The control blocks (particularly the output information acquisition component 211, the damage calculator 212, the usability determination component 213, and the usage state determination component 214) of the battery management devices 20 and 1020 may be realized by a logic circuit formed on an integrated circuit (IC chip) or the like (hardware), or by software using a CPU (central processing unit).

In the latter case, the battery management devices 20 and 1020 comprise a CPU that executes the commands of a program, which is software for carrying out various functions, a ROM (read only memory) or a storage device (these are referred to as "recording media") in which the above-mentioned program and various kinds of data are recorded so as to be readable by a computer (or CPU), a RAM (random access memory) for developing the program, etc. The computer (or CPU) then reads the program from the recording medium and executes the program. The recording medium can be a "non-transitory tangible medium," such as a tape, disk, card, semiconductor memory, or programmable logic circuit. Also, the above-mentioned program may be supplied to the computer via any transmission medium capable of transmitting the program (a communication network, a broadcast wave, etc.). One or more embodiments of the present invention can also be realized in the form of a data signal embedded in a carrier wave, in which the program is embodied by electronic transmission.

One or more embodiments of the present invention were described above, but the present invention is not limited to or by the above embodiments, and various modifications are possible without departing from the gist of the invention.

(A)

With the systems 1 and 1001 in one or more of the above embodiments, the physical load information acquisition component 11c is provided in addition to the external environment information acquisition component 11b and the internal environment information acquisition component 11a, but the physical load information acquisition component 11c need not be provided.

Figure 12:
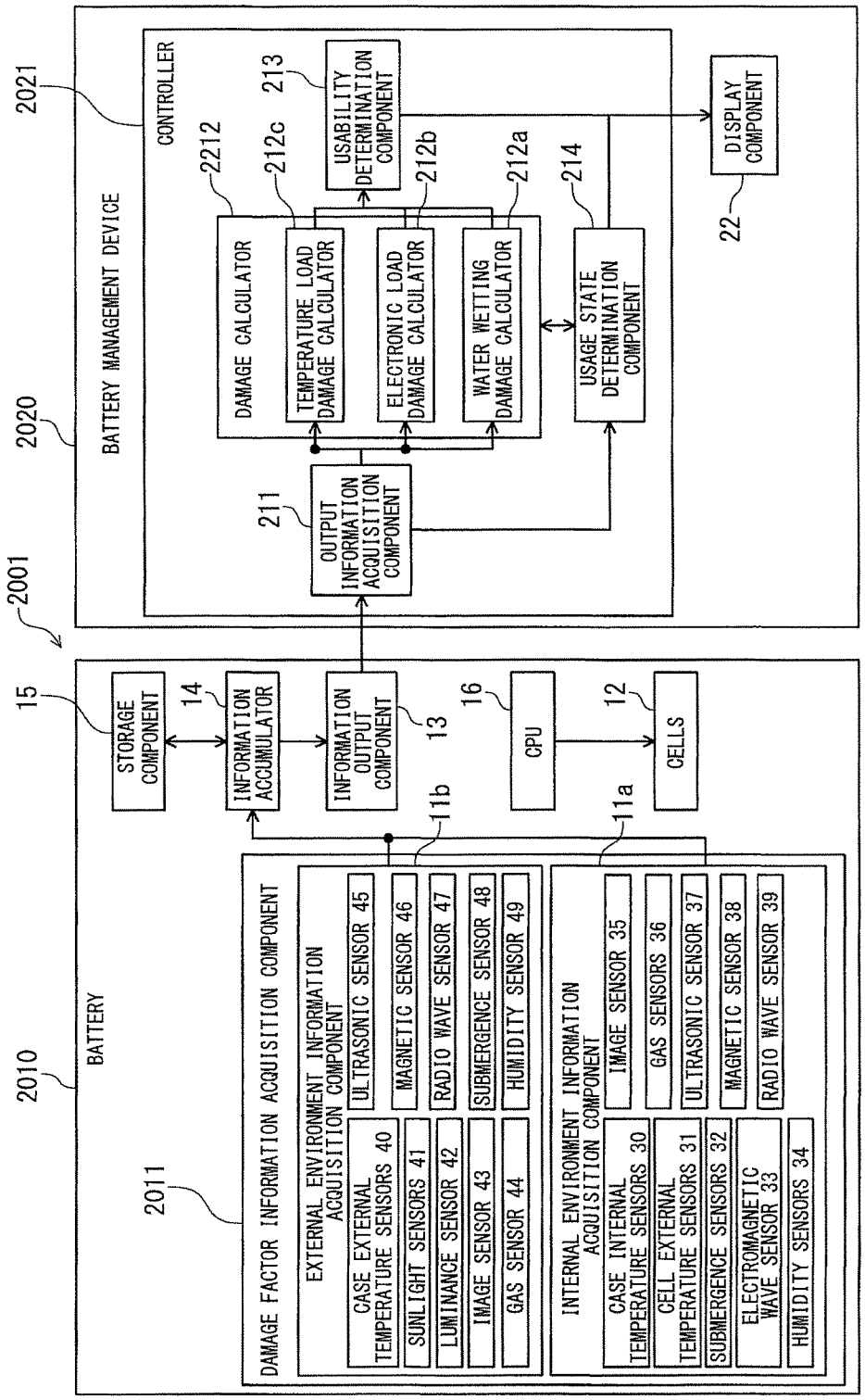
FIG. 12 is a block diagram showing the configuration of a battery swap system pertaining to a modification example of one or more embodiments.

FIG. 12 is a diagram showing a battery swap system 2001 (hereinafter referred to as the system 2001) in which the physical load information acquisition component 11c is not provided. The system 2001 shown in FIG. 12 comprises a battery 2010 and a battery management device 2020. A damage factor information acquisition component 2011 of the battery 2010 differs from the damage factor information acquisition component 11 of the battery 1010 shown in FIG. 10 in that the physical load information acquisition component 11c is not provided, but the internal environment information acquisition component 11a and the external environment information acquisition component 11b are provided. Also, a damage calculator 2212 provided to a controller 2021 of the battery management device 2020 differs from the damage calculator 212 of the battery management device 1020 shown in FIG. 10 in that the physical load damage calculator 212d is not provided, and only the water wetting damage calculator 212a, the electronic load damage calculator 212b, and the temperature load damage calculator 212c are provided.

That is, with the system 2001, information about the environment on the inside and the outside of the case 17 of the battery 2010 is acquired by the various sensors had by the internal environment information acquisition component 11a and the external environment information acquisition component 11b, and is stored in the storage component 15. The battery management device 2020 then acquires the stored information about the internal and external environments, the degree of damage is calculated by the damage calculator 2212, and it is determined whether the battery is usable. Also, the battery management device 2020 uses the acquired information about the internal and external environments to determine the usage state with the usage state determination component 214.

(B)

Figure 13:
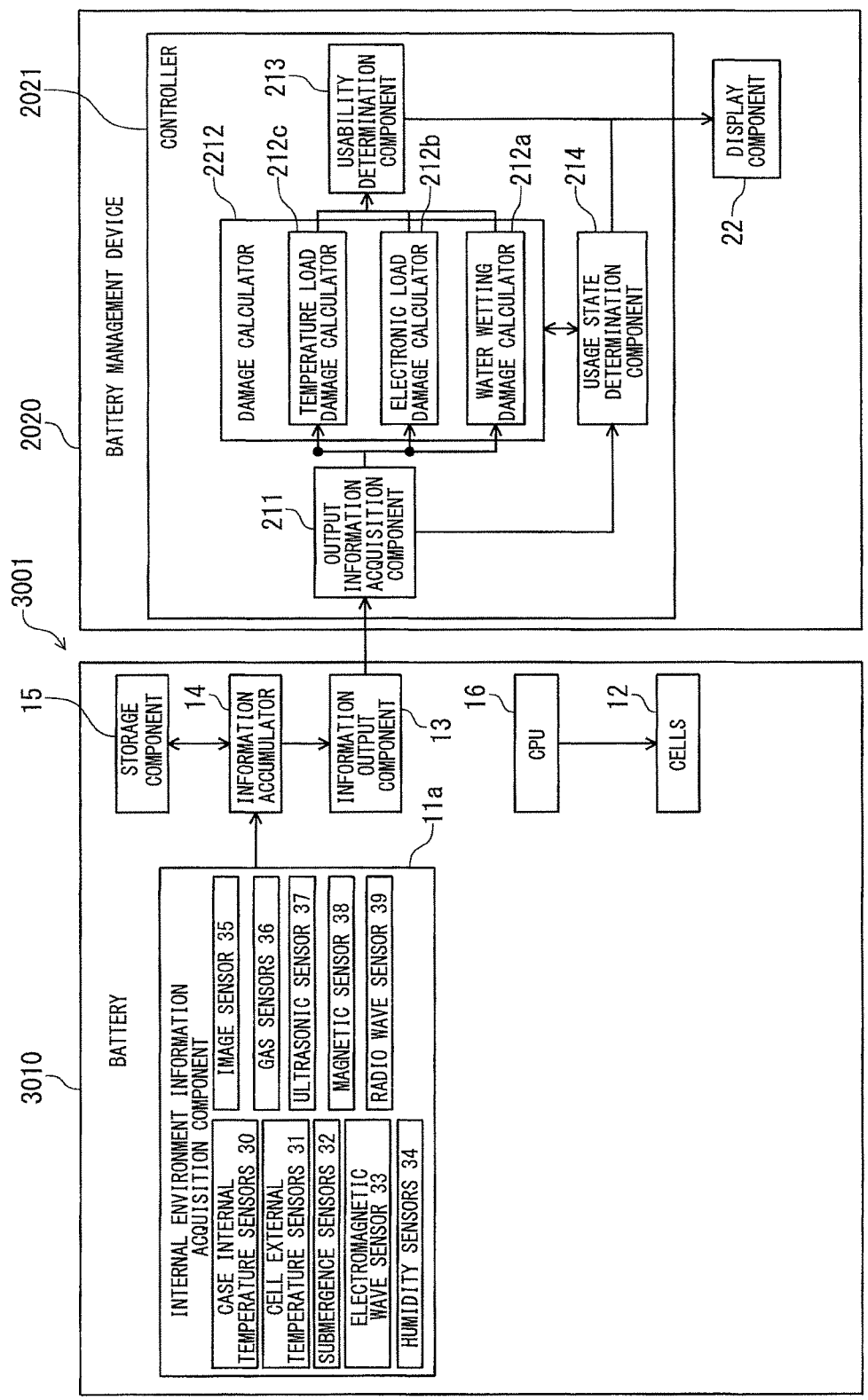
FIG. 13 is a block diagram showing the configuration of a battery swap system pertaining to a modification example of one or more embodiments.

With the systems 1 and 1001 in one or more of the above embodiments, the external environment information acquisition component 11b, the internal environment information acquisition component 11a, and the physical load information acquisition component 11c were provided, but the external environment information acquisition component 11b and the physical load information acquisition component 11c need not be provided. A battery swap system 3001 such as this (hereinafter referred to as the system 3001) is shown in FIG. 13. The system 3001 comprises a battery 3010 and the battery management device 2020 shown in FIG. 12. The battery 3010 comprises an internal environment information acquisition component 11a as a damage factor information acquisition component.

With the system 3001, internal environment information about the case 17 of the battery 3010 is acquired by the various sensors included in the internal environment information acquisition component 11a and stored in the storage component 15. The battery management device 2020 then acquires the stored internal environment information and calculates the degree of damage with the damage calculator 2212 to determine whether or not the battery can be used. The battery management device 2020 also uses the acquired internal environment information to determine the usage state with the usage state determination component 214.

(C)

Figure 14:
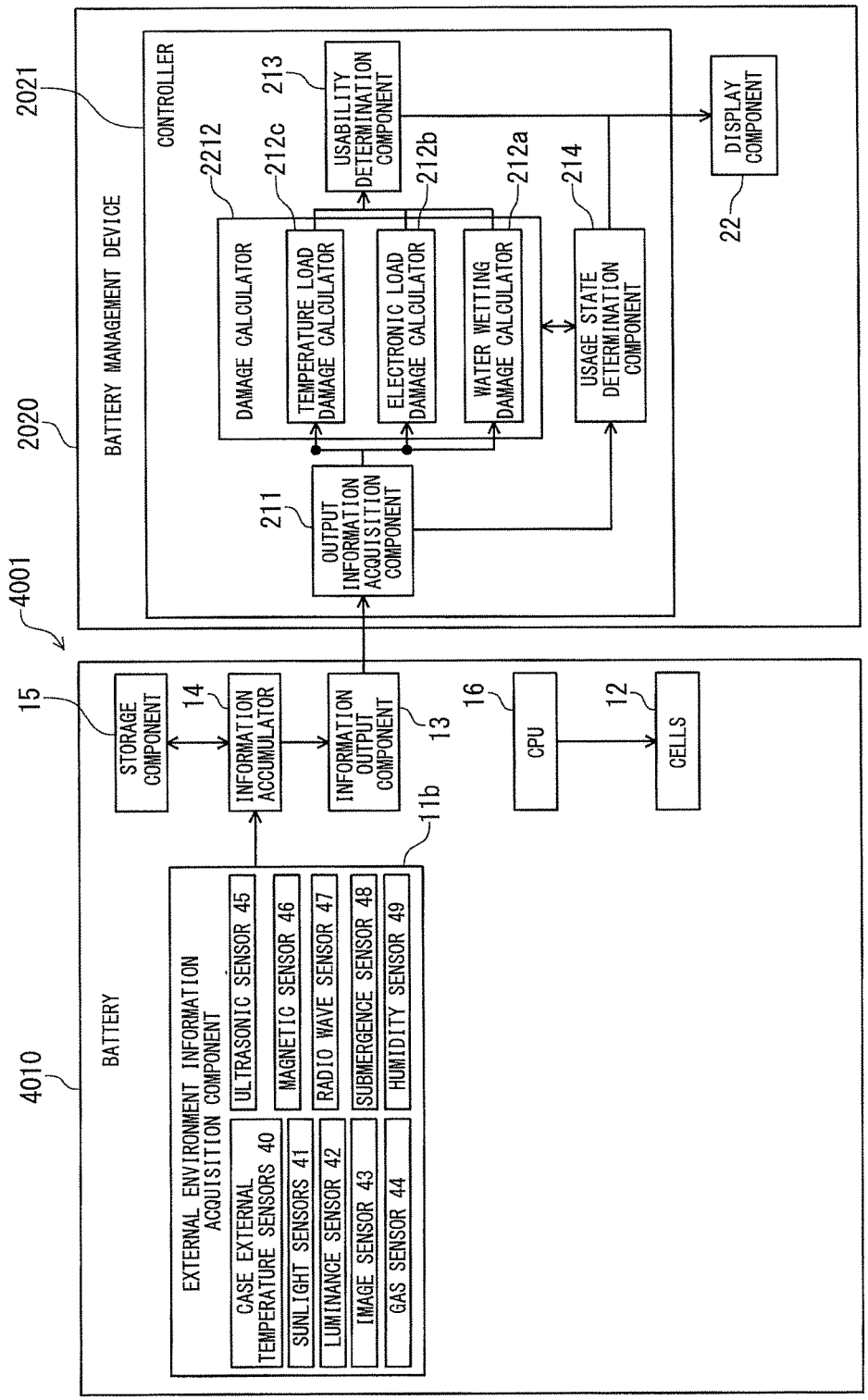
FIG. 14 is a block diagram showing the configuration of a battery swap system pertaining to a modification example of one or more embodiments.

With the systems 1 and 1001 in one or more of the above embodiments, the external environment information acquisition component 11b, the internal environment information acquisition component 11a, and the physical load information acquisition component 11c were provided, but the internal environment information acquisition component 11a and the physical load information acquisition component 11c need not be provided. A battery swap system 4001 such as this (hereinafter referred to as the system 4001) is shown in FIG. 14. The system 4001 comprises a battery 4010 and the battery management device 2020 shown in FIG. 12. The battery 4010 comprises the external environment information acquisition component 11b as a damage factor information acquisition component.

With the system 4001, external environment information about the case 17 of the battery 4010 is acquired by the various sensors included in the external environment information acquisition component 11b and is stored in the storage component 15. The battery management device 2020 then acquires the stored external environment information and calculates the degree of damage with the damage calculator 2212 to determine whether or not the battery can be used. The battery management device 2020 also uses the acquired external environment information to determine the usage state with the usage state determination component 214.

(D)

With the systems 1 and 1001 in one or more of the above embodiments, the physical load information, the external environment information, and the internal environment information acquired by the damage factor information acquisition component 11 are stored in the storage component 15 via the information accumulator 14, but this is not the only option. For example, with the battery 5010 of the battery swap system 5001 shown in FIG. 15, the physical load information, the external environment information, and the internal environment information acquired by the damage factor information acquisition component 11 are sent in real time by a communication component 5017 to the battery management device 20. The output information acquisition component 211 of the battery management device 20 is configured to be able to communicate wirelessly with a communication component 5017. The battery management device 20 calculates the degree of damage for damage factor information that is sequentially transmitted.

Instead of real-time communication, the configuration may be such that the storage component 15 is provided along with the communication component 5017 to the battery 5010, and information for a specific length of time is stored in the storage component 15 and then transmitted.

Figure 15:
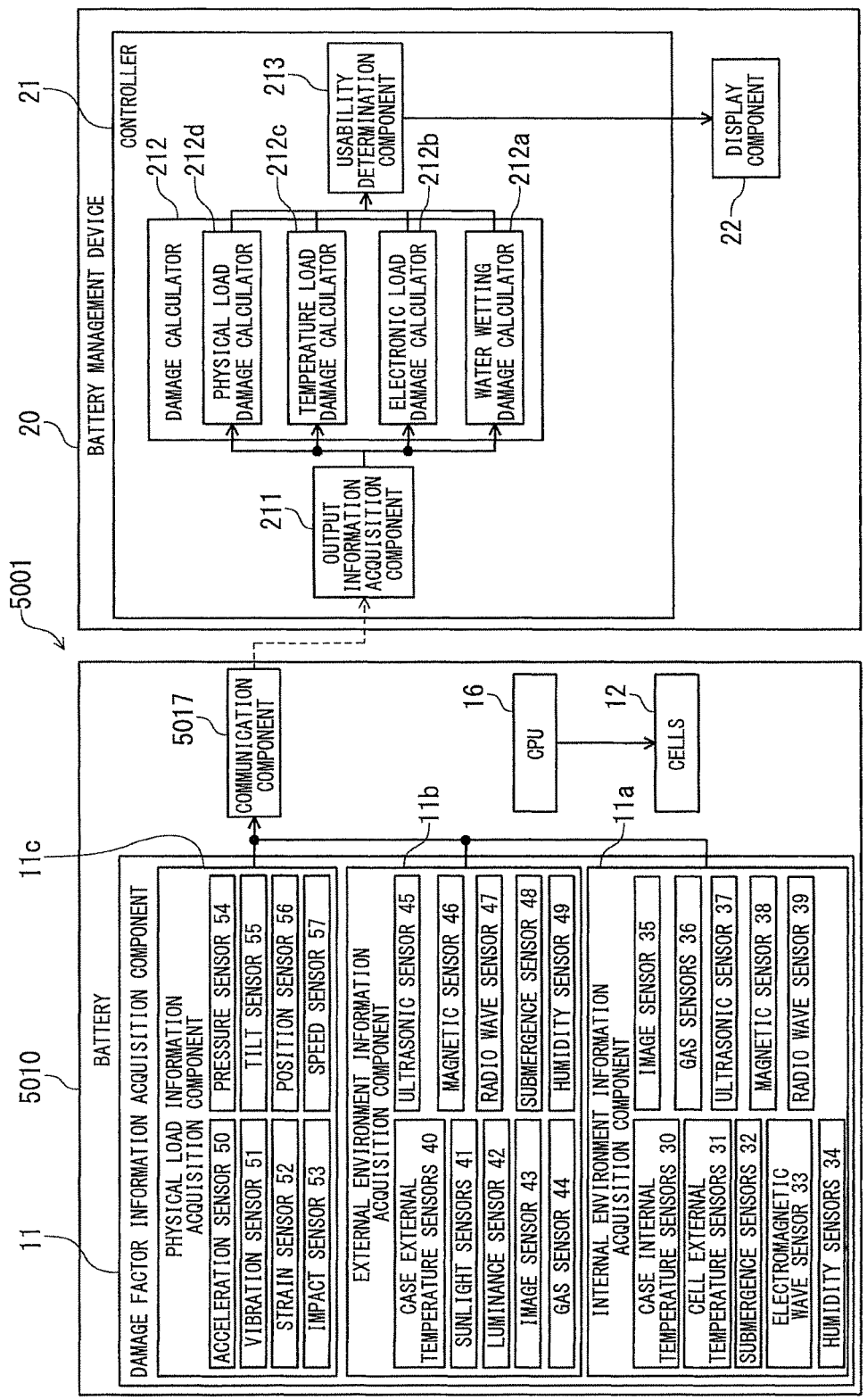
FIG. 15 is a block diagram showing the configuration of a battery swap system pertaining to a modification example of one or more embodiments.

Also, in the battery swap system 5001 shown in FIG. 15, the controller 21 (information processing device) of the battery management device 20 may be a virtual server in a cloud computing system. In this case, the physical load information, the external environment information, and the internal environment information are sent from the communication component 5017 to the cloud computing system. The information is then analyzed at the virtual server, and the user can obtain the analysis result by accessing the cloud computing system.

(E)

In one or more of the above embodiments, the battery 10 and the battery management device 20 were described as being configured separately, but in an modification example, the battery 10 (at least the damage factor information acquisition component 11 of the battery 10) and the battery management device 20 may be configured integrally as a battery damage calculation device. The battery damage calculation device pertaining to this modification example comprises the external environment information acquisition component 11b that acquires specific environment information on the outside of the case 17 (outer case) of the battery 10, the internal environment information acquisition component 11a that acquires corresponding environment information, and the damage calculator 212 that uses the specific environment information and the corresponding environment information to calculate the degree of damage to the battery 10.

(F)

The systems 1001, 2001, 3001, and 4001 of one or more of the above embodiments comprised usage state determination component 214, the damage calculator 212, and the usability determination component 213, but the damage calculator 212 and the usability determination component 213 need not be provided. In this case, only the determination of the usage state is performed.

(G)

Although not specifically mentioned in one or more of the above embodiments, the battery management devices 20, 1020, and 2020 may be provided to a station from which the batteries 10 are loaned out, system that manages a plurality of stations, etc. The display component 22 of the battery management devices 20, 1020, and 2020 may utilize the screen of a smart phone, a tablet, or the like owned by the user.

(H)

The layout of the various sensors shown in FIGS. 2A to 2D in one or more embodiments is just an example, and the layout and number of the various sensors may be changed as needed.

(I)

In one or more of the above embodiments, the cell housing case 18 for housing a plurality of cells, and the electronic board housing case 19 for housing the electronic board 16a were provided, but one or both of these may be eliminated.

(J)

The battery management device 20 of one or more embodiments above comprised the output information acquisition component 211, the damage calculator 212, and the usability determination component 213, but the usability determination component 213 need not be provided, and the battery management device 20 may function as a battery damage calculation device.

(K)

In one or more of the above embodiments, an electric car or other such vehicle is an example of the power consuming unit in which the batteries 10, 2010, 3010, 4010, and 5010 loaned out from the systems 1, 1001, 2001, 3001, 4001, and 5001 are installed. More specifically, examples of vehicles (move body) include the above-mentioned electric cars (EVs), electric motorcycles, electric unicycles, electric bicycles, motor-assisted bicycles, and PHVs (plug-in hybrid vehicles).

Also, the power consuming unit in which the battery is installed is not limited to a move body, and may also be other electrical products that are driven by exchangeable batteries. Examples of these electrical products include refrigerators, washing machines, vacuum cleaners, rice cookers, electric kettles, and other such household appliances that run on power from a battery.

Furthermore, the power consuming unit in which the battery is installed may be a power tool. In this case, the battery used in the power tool may be charged at a battery station or the like where a plurality of batteries that can be loaned out are charged.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

INDUSTRIAL APPLICABILITY

The pressure information can be utilized in a battery.

REFERENCE SIGNS LIST 10 battery
11a internal environment information acquisition component
11b external environment information acquisition component
17 case (outer case)
21 controller (information processing device)
211 output information acquisition component (battery environment information acquisition component)
212 damage calculator

The invention claimed is:

1. A battery, comprising:
one or more cells;
an outer case that houses the one or more cells;
an external environment information acquisition component that measures external environment information on an outside of the outer case; and
an internal environment information acquisition component that measures internal environment information on an inside of the outer case; and
an output component that communicates at least one of the external environment information and the internal environment information via a wired or wireless connection to a battery management device, wherein at least one of the external environment information and the internal environment information is used to perform at least one of: environment information analysis, calculation of degree of damage to the battery, and determination of a usability of the battery, and the battery is carried in alone in a system in which a plurality of batteries are to be loaned out.

2. The battery according to claim 1,
wherein the external environment information acquisition component and the internal environment information acquisition component are same type of sensor.

3. The battery according to claim 2,
wherein the external environment information acquisition component comprises one or more temperature sensors,
the external environment information is temperature on the outside of the outer case,
the internal environment information acquisition component comprises one or more temperature sensors, and
the internal environment information is temperature on the inside of the outer case.

4. The battery according to claim 1,
wherein the external environment information acquisition component and the internal environment information acquisition component are different types of sensor.

5. The battery according to claim 4,
wherein the external environment information acquisition component comprises one or more sunlight sensors,
the external environment information is an amount of sunlight on the outer case,
the internal environment information acquisition component has one or more temperature sensors, and
the internal environment information is temperature on the inside of the outer case.

6. The battery according to claim 1,
wherein the internal environment information acquisition component comprises a plurality of internal environment information acquisition sensors disposed between the cells and walls of the outer case.

7. The battery according to claim 6,
further comprising a cell housing case disposed on the inside of the outer case and formed so as to surround the one or more cells,
wherein at least one of the internal environment information acquisition sensors is disposed near the cells and on the inside of the cell housing case, and
at least one of the internal environment information acquisition sensors is disposed on the inside of the outer case and on the outside of the cell housing case.

8. The battery according to claim 1,
further comprising a communication component that sends the external environment information measured by the external environment information acquisition component and the internal environment information measured by the internal environment information acquisition component to an information processing device that analyzes environment information about the battery.

9. The battery according to claim 8,
wherein the information processing device is a virtual server in cloud computing.

10. A system, comprising:
the battery according to claim 1; and
an information processing device,
wherein the information processing device comprises:
a battery environment information acquisition component that acquires the external environment information from the external environment information acquisition component and the internal environment information from the internal environment information acquisition component;
an environment information analysis component that uses the external environment information and the internal environment information acquired by the battery environment information acquisition component to analyze environment information about the battery, and
an output device that outputs results of analyzing environmental information.

11. The system according to claim 10,
wherein the environment information analysis component comprises a damage calculator that uses the external environment information and the internal environment information acquired by the battery environment information acquisition component to calculate degree of damage to the battery, and
wherein the degree of damage to the battery is output via the output device.

12. The system according to claim 11,
wherein the environment information analysis component further comprises a usability determination component that determines whether or not the battery can be used, on the basis of the degree of damage calculated by the damage calculator, and
wherein usability of the battery is output via the output device.

13. The system according to claim 10,
wherein the environment information analysis component comprises a usage state determination component that uses the external environment information and the internal environment information acquired by the battery environment information acquisition component to determine a usage state of the battery, and
wherein the usage state of the battery is output via the output device.

14. The system according to claim 10,
wherein the external environment information acquisition component comprises a temperature sensor,
the external environment information is temperature on the outside of the outer case,
the internal environment information acquisition component comprises one or more temperature sensors disposed between the cells and walls of the outer case,
the internal environment information is temperature on the inside of the outer case, and
the environment information analysis component estimates temperature of the cells on the basis of the values sensed by the temperature sensor had by the external environment information acquisition component and the temperature sensor had by the internal environment information acquisition component.

15. A battery management method for managing a battery comprising one or more cells, an outer case that houses the one or more cells, an external environment information acquisition component, and an internal environment information acquisition component, the battery management method comprising:
an environment information acquisition that measures external environment information on an outside of the outer case using the external environment information acquisition component and internal environment information on an inside using the internal environment information acquisition component;
an environment information analysis that uses the external environment information and the internal environment information acquired in the environment information acquisition to analyze environment information about the battery; and outputting, via an output device, results of analyzing environmental information, wherein the battery is carried in alone in a system in which a plurality of batteries are to be loaned out.

16. The battery management method according to claim 15, wherein the environment information analysis further comprises a usage state determination that uses the external environment information and the internal environment information acquired in the environment information acquisition to determine a usage state of the battery.

17. The battery management method according to claim 15, wherein the external environment information is temperature on the outside of the outer case, the internal environment information is temperature on the inside of the outer case, and the environment information analysis further comprises:

a cell interior temperature estimation that uses the temperature on the outside of the outer case and the temperature on the inside of the outer case acquired in the environment information acquisition to estimate temperature on the inside of the cells; and a degree of damage calculation that calculates a degree of damage to the battery from a result of estimating the temperature on the inside of the cells in the cell interior temperature estimation.

18. A battery management program for managing a battery comprising one or more cells, an outer case that houses the one or more cells, an external environment information acquisition component, and an internal environment information acquisition component, wherein the battery management program causes a computer to execute a battery management method comprising:

an environment information acquisition that measures external environment information on an outside of the battery using the external environment information acquisition component and internal environment information on an inside using the internal environment information acquisition component;

an environment information analysis that uses the external environment information and the internal environment information acquired in the environment information acquisition to analyze environment information about the battery; and outputting, via an output device, results of analyzing environmental information, wherein the battery is carried alone in a system in which a plurality of batteries are to be loaned out.

19. A non-transitory computer readable recording medium to which the battery management program according to claim 18 is recorded, and which is configured to be processed by a computer.

* * * * *